(12) United States Patent
Sasaki et al.

(10) Patent No.: US 8,552,534 B2
(45) Date of Patent: Oct. 8, 2013

(54) LAMINATED SEMICONDUCTOR SUBSTRATE, SEMICONDUCTOR SUBSTRATE, LAMINATED CHIP PACKAGE AND METHOD OF MANUFACTURING THE SAME

(75) Inventors: Yoshitaka Sasaki, Milpitas, CA (US); Hiroyuki Ito, Milpitas, CA (US); Shigeki Tanemura, Milpitas, CA (US); Kazuki Sato, Milpitas, CA (US); Atsushi Iijima, Hong Kong (CN)

(73) Assignees: Headway Technologies, Inc., Milpitas, CA (US); Sae Magnetics (H.K.) Ltd., Hong Kong (CN)

( * ) Notice: Subject to any disclaimer, the term of this patent is extended or adjusted under 35 U.S.C. 154(b) by 216 days.

(21) Appl. No.: 13/286,728

(22) Filed: Nov. 1, 2011

(65) Prior Publication Data

US 2013/0105949 A1 May 2, 2013

(51) Int. Cl.
*H01L 23/544* (2006.01)
*H01L 23/34* (2006.01)

(52) U.S. Cl.
USPC .................................................... 257/620

(58) Field of Classification Search
USPC .......... 257/74, 618, 620, 621, 622, 684, 686, 257/688, 692, 693, 723–725, 730, 735, 736, 257/772, 773–777, 786, E25.006, E25.013, 257/E23.011, E23.012, E23.039, E23.114, 257/E21.614; 438/3, 26, 33, 42, 106, 107, 438/109, 113, 455, 458, 460, 461, 462, 9, 438/53

See application file for complete search history.

(56) References Cited

U.S. PATENT DOCUMENTS

| 7,676,912 B2 | 3/2010 | Sasaki et al. |
| 7,816,176 B2 | 10/2010 | Sasaki et al. |
| 8,426,948 B2 * | 4/2013 | Sasaki et al. .................. 257/620 |

FOREIGN PATENT DOCUMENTS

| JP | A-2003-7909 | 1/2003 |
| JP | A-2008-53287 | 3/2008 |

* cited by examiner

*Primary Examiner* — Chuong A Luu
*Assistant Examiner* — Cory Eskridge
(74) *Attorney, Agent, or Firm* — Oliff & Berridge, PLC

(57) ABSTRACT

In a laminated semiconductor substrate, a plurality of semiconductor substrates are laminated. Each of the semiconductor substrate has a plurality of scribe-groove parts formed along scribe lines. Further, each of the semiconductor substrate has a plurality of device regions having a semiconductor device formed therein and insulated from each other, and a plurality of wiring electrodes connected to the semiconductor devices respectively formed in the plurality of device regions and extending from the device regions into the inside of the scribe-groove parts. The plurality of wiring electrodes are arranged in a partial arrangement pattern in which the wiring electrodes are arranged along only a part of four boundary sides, corresponding to boundaries between each of the device regions and the scribe-groove parts. Further, the plurality of wiring electrodes extend into the scribe-groove part from only one of two device regions adjacent to each other with the scribe-groove part therebetween.

22 Claims, 36 Drawing Sheets

LAMINATED SEMICONDUCTOR SUBSTRATE, SEMICONDUCTOR SUBSTRATE, LAMINATED CHIP PACKAGE AND METHOD OF MANUFACTURING THE SAME

BACKGROUND

1. Field of the Invention

The present invention relates to a laminated semiconductor substrate, semiconductor substrate for manufacturing a laminated chip package including a plurality of semiconductor chips, a laminated chip package and a method of manufacturing the same.

2. Related Background Art

In recent years, electronic devices such as cellular phones and notebook personal computers need to be reduced in weight and improved in performance. With such needs, higher integration of electronic components used for the electronic devices has been required. Further, the higher integration of electronic components has been required also for increase in capacity of a semiconductor memory device.

Recently, System in Package (hereinafter referred to as a "SIP") has attracted attention as a highly integrated electronic component. The SIP is a device created by stacking a plurality of LSIs and mounting them in one package, and a SIP using the three-dimensional mounting technique of laminating a plurality of semiconductor chips has received attention recently. Known as such a SIP is a package having a plurality of laminated semiconductor chips, that is, a laminated chip package. The laminated chip package has an advantage that speed up of operation of circuits and reduction in stray capacitance of wiring become possible because the length of the wiring can be reduced as well as an advantage of capability of high integration.

Known as the three-dimensional mounting techniques for manufacturing the laminated chip package include a wire bonding system and a through electrode system. The wire bonding system is a system of laminating a plurality of semiconductor chips on a substrate and connecting a plurality of electrodes formed on each of the semiconductor chips and external connecting terminals formed on the substrate by wire bonding. The through electrode system is a system of forming a plurality of through electrodes in each of the laminated semiconductor chips and realizing wiring between the respective semiconductor chips by the through electrodes.

The wire bonding system has a problem of a difficulty in reducing the spaces between the electrodes in a manner that the wires are not in contact with each other, a problem of a difficulty in speeding up the operation of circuits because of a high resistance value of wires, and a problem of a difficulty in reducing the thickness.

Though the above-described problems in the wire bonding system are solved in the through electrode system, the through electrode system has a problem of increased cost of the laminated chip package because many processes are required for forming the through electrodes in each of the semiconductor chips.

Conventionally, as technology in regard to the laminated chip package, for example, technologies disclosed in Japanese Patent Application Laid-Open No. 2003-7909 (referred also to as patent document 1), Japanese Patent Application Laid-Open No. 2008-53287 (referred also to as patent document 2) are known.

The patent document 1 discloses a semiconductor device having through electrodes which reach a rear surface from a front surface. In this semiconductor device disclosed in the patent document 1, the plurality of through electrodes are formed around a circuit element part so as to surround the circuit element part (see, for example, FIG. 10 and so on of the patent document 1). Further, the patent document 2 discloses a semiconductor device in which a plurality of through electrodes are formed along a pair of opposing peripheral parts among four peripheral parts surrounding a rectangular imaging element (see, for example, FIG. 2 and so on of the patent document 2).

SUMMARY OF THE INVENTION

By the way, FIG. 36 illustrates a semiconductor substrate 300 relating to the semiconductor substrate disclosed in the above-described patent document 1. In the semiconductor substrate 300, a plurality of semiconductor regions 304 are formed on the semiconductor substrate 300. On the semiconductor substrate 300, a plurality of groove parts 303A, 303B along scribe lines 302A, 302B are formed in a lattice form. Then, the semiconductor substrate 300 is cut at the plurality of groove parts 303A, 303B along the scribe lines 302A, 302B, whereby the rectangular semiconductor regions 304 are divided into chip-like members. Each of the chip-like members is used to form a semiconductor device 301. Each semiconductor device 301 is formed such that a plurality of through electrodes 305 are connected to the semiconductor region 304.

However, in the case of the semiconductor substrate 300, the plurality of semiconductor regions 304, 304 are formed adjacent to each other with the groove part 303A, 303B between them. Further, the plurality of through electrodes 305 connected to the respective semiconductor regions 304, 304 extend from both sides of the groove part 303A, 303B into the inside of the groove part 303A, 303B. Further, in order to keep the through electrodes 305 remain without being cut when the semiconductor substrate 300 is cut at the plurality of groove parts 303A, 303B, it is necessary to make the widths of the groove parts 303A, 303B larger than the width of a dicing saw or the like used for cutting.

In order to increase the number of laminated chip packages which can be manufactured per unit time to reduce the manufacturing cost of the laminated chip package, it is desirable to obtain semiconductor devices 301 as many as possible from one semiconductor substrate 300. In this point, it is preferable to make the widths of the groove parts 303A, 303B as small as possible because no semiconductor device is formed in the groove parts 303A, 303B. When the widths of the groove parts 303A, 303B are made smaller, the region in the semiconductor substrate 300 allocated to the semiconductor regions 304 is increased, so that the number of semiconductor regions 304 formed on the semiconductor substrate 300 can be increased. This makes it possible to cut out more semiconductor devices 301 when the semiconductor substrate 300 is cut at the groove parts 303A, 303B, leading to a reduction in manufacturing cost of the laminated chip package.

However, since the conventional semiconductor substrate has a structure in which the through electrodes 305 extend from both sides of the groove part 303A, 303B as in the above-described semiconductor substrate 300, two through electrodes 305 need to be arranged side by side inside the groove parts 303A, 303B and along the width direction thereof. Therefore, the conventional semiconductor substrate has a structure in which the width of the groove part is difficult to reduce. Accordingly, it is difficult to increase the number of semiconductor devices obtainable from one semiconductor substrate and to reduce the manufacturing cost of the laminated chip package in the prior art.

The present invention is made to solve the above problem, and it is an object to increase the number of laminated chip packages which can be manufactured per unit time to reduce the manufacturing cost of the laminated chip package in a laminated semiconductor substrate, a semiconductor substrate and a laminate chip package and in a method of manufacturing the same.

To solve the above problem, the present invention is a laminated semiconductor substrate laminated a plurality of semiconductor substrates having a plurality of scribe-groove parts formed along scribe lines, the plurality of semiconductor substrates each including: a plurality of device regions each in contact with at least one of the plurality of scribe-groove parts, having a semiconductor device formed therein, formed in a rectangular shape, and insulated; and a plurality of wiring electrodes connected to the semiconductor devices respectively formed in the plurality of device regions and extending from the device regions into the inside of the scribe-groove parts, the plurality of wiring electrodes are arranged, for each of the plurality of device regions, in a partial arrangement pattern in which the wiring electrodes are arranged along only a part of four boundary sides corresponding to boundaries between each of the device regions and the scribe-groove parts, and extend into the scribe-groove part from only one of two device regions adjacent to each other with the scribe-groove part therebetween among the plurality of device regions, the laminated semiconductor substrate including: a through hole formed therein which penetrates the scribe-groove parts of the plurality of semiconductor substrates laminated in a laminated direction in which the plurality of semiconductor substrates are laminated, and in which a plurality of the wiring electrodes, constituting a laminated electrode group laminated in the laminated direction among the plurality of wiring electrodes, appear; a through electrode which penetrates all of the plurality of semiconductor substrates through the through hole and is in contact with all of the wiring electrodes appearing in the through hole; and a plurality of laminated chip regions each of which is composed of the device regions laminated in the laminated direction in all of the plurality of semiconductor substrates.

Since a plurality of wiring electrodes are arranged in a partial arrangement pattern in the above-described laminated semiconductor substrate, there are a part where the wiring electrodes are arranged and a part where the wiring electrodes are not arranged, around the device region. In addition, since the plurality of wiring electrodes extend to the scribe-groove part from only one of the two device regions adjacent to each other with the scribe-groove part between them and therefore extend from a single side of the scribe-groove part.

Further, in case of the above-described laminated semiconductor substrate, it is preferable that the wiring electrode has an electrode pad having a hole part formed along the laminated direction, and the electrode pad is arranged in the scribe-groove part without a gap formed between the electrode pad and the boundary side.

In such a laminated semiconductor substrate, since the gap between the electrode pad and the boundary side is eliminated, the size of the wiring electrode bulging out to the scribe-groove part becomes smaller.

Further, in case of the above-described laminated semiconductor substrate, it is preferable that the plurality of scribe-groove parts are formed in a lattice form in which a plurality of lateral groove parts formed in a lateral direction and a plurality of longitudinal groove parts intersecting at right angles to the lateral groove parts intersect in a cross shape, and the wiring electrodes extend from only one of the two device regions adjacent to each other with the scribe-groove part therebetween in all of the plurality of lateral groove parts and the plurality of longitudinal groove parts.

In the case of such a laminated semiconductor substrate, the wiring electrode extends only from a single side of the scribe-groove part in any scribe-groove part.

Further, in case of the above-described laminated semiconductor substrate, it is preferable that assuming that a direction in which the wiring electrodes extend from the device region into the scribe-groove part is an extending direction, the extending direction and the partial arrangement pattern are common in all of the plurality of device regions.

In the case of such a laminated semiconductor substrate, the partial arrangement pattern of the wiring electrodes becomes common in all of the device regions and, in addition, the extending directions of the wiring electrodes to the scribe-groove parts are unified.

Further, in case of the above-described laminated semiconductor substrate, it is preferable that the partial arrangement pattern is an L-figure like pattern in which two boundary sides connected in an L-figure like among the four boundary sides in each of the plurality of device regions are set as electrode sides along which the wiring electrodes are arranged and two boundary sides other than the electrode sides are set as electrodeless sides along which the wiring electrodes are not arranged, and the L-figure like pattern is common in all of the plurality of device regions.

Further, in case of the above-described laminated semiconductor substrate, it is preferable that assuming that a width of a cutting member used in cutting the laminated semiconductor substrate at the scribe-groove part is a cut width and a width of the electrode pad bulging out from the boundary side is a pad width, a width of the scribe-groove part is set not to exceed a size obtained by adding the cut width and the pad width.

Further, in case of the above-described laminated semiconductor substrate, it is preferable that the wiring electrode has an electrode pad having a hole part formed along the laminated direction, and the through hole is formed along the hole part.

In case of the above-described laminated semiconductor substrate, it is preferable that the electrode pad is formed in a rectangular shape or in a U-figure like shape disposed such that both end parts open toward the inside of the scribe-groove part.

In the above-described laminated semiconductor substrate, it is preferable that the laminated semiconductor substrate is composed by laminating one or two or more unit laminated substrates in each of which four semiconductor substrates are laminated.

Further, the present invention provides a semiconductor substrate having a plurality of scribe-groove parts formed along scribe lines, a plurality of device regions each in contact with at least one of the plurality of scribe-groove parts, having a semiconductor device formed therein, formed in a rectangular shape, and insulated; and a plurality of wiring electrodes connected to the semiconductor devices respectively formed in the plurality of device regions and extending from the device regions into the inside of the scribe-groove parts, the plurality of wiring electrodes are arranged in a partial arrangement pattern in which the wiring electrodes are arranged along only a part of four boundary sides corresponding to boundaries between each of the device regions and the scribe-groove parts for each of the plurality of device regions, and extend into the scribe-groove part from only one of two device regions adjacent to each other with the scribe-groove part therebetween among the plurality of device regions.

In case of the above-described semiconductor substrate, it is preferable that the wiring electrode has an electrode pad having a hole part formed along a laminated direction, and the electrode pad is arranged in the scribe-groove part without a gap formed between the electrode pad and the boundary side.

In case of the above-described semiconductor substrate, it is preferable that the plurality of scribe-groove parts are formed in a lattice form in which a plurality of lateral groove parts formed in a lateral direction and a plurality of longitudinal groove parts intersecting at right angles to the lateral groove parts intersect in a cross shape, and the wiring electrodes extend from only one of the two device regions adjacent to each other with the scribe-groove part therebetween in all of the plurality of lateral groove parts and the plurality of longitudinal groove parts.

Further, it is preferable that assuming that a direction in which the wiring electrodes extend from the device region into the scribe-groove part is an extending direction, the extending direction and the partial arrangement pattern are common in all of the plurality of device regions.

In case of the above-described semiconductor substrate, it is preferable that the partial arrangement pattern is an L-figure like pattern in which two boundary sides connected in an L-figure like among the four boundary sides in each of the plurality of device regions are set as electrode sides along which the wiring electrodes are arranged and two boundary sides other than the electrode sides are set as electrodeless sides along which the wiring electrodes are not arranged, and the L-figure like pattern is common in all of the plurality of device regions.

Further, it is preferable that assuming that a width of a cutting member used in cutting the semiconductor substrate at the scribe-groove part is a cut width and a width of the electrode pad bulging out from the boundary side is a pad width, a width of the scribe-groove part is set not to exceed a size obtained by adding the cut width and the pad width.

Further, the present invention provides a laminated chip package laminated a plurality of semiconductor chips having a semiconductor device, the plurality of semiconductor chips each including: a resin insulating layer made of an insulating resin formed to surround a periphery of a device region in a rectangular shape in which the semiconductor device is formed; and a plurality of wiring electrodes connected to the semiconductor device and having end parts arranged on the resin insulating layer, the plurality of wiring electrodes are arranged in a partial arrangement pattern in which the wiring electrodes are arranged along only a part of four boundary sides corresponding to boundaries between the device region and the resin insulating layer, and two boundary sides connected in an L-figure like among the four boundary sides in the device region are set as electrode sides along which the wiring electrodes are arranged and two boundary sides other than the electrode sides are set as electrodeless sides along which the wiring electrodes are not arranged, the laminated chip package including: a through hole formed therein which penetrates the resin insulating layers of the plurality of semiconductor chips laminated in a laminated direction in which the plurality of semiconductor chips are laminated, and in which a plurality of the wiring electrodes, constituting a laminated electrode group laminated in the laminated direction among the wiring electrodes, appear; and a through electrode which penetrates all of the plurality of semiconductor chips through the through hole and is in contact with all of the wiring electrodes appearing in the through hole.

In case of the above-described laminated chip package, it is preferable that the wiring electrode has an electrode pad arranged on the resin insulating layer and having a hole part formed along the laminated direction, and the electrode pad is arranged on the resin insulating layer without a gap formed between the electrode pad and the boundary side.

Further, the present invention provides a method of manufacturing a laminated semiconductor substrate, including the following steps (1) to (5):

(1) a device region forming step of forming a plurality of scribe-groove parts along scribe lines in an unprocessed substrate having semiconductor devices formed therein to form a plurality of device regions each of which is in contact with at least one of the plurality of scribe-groove parts and has the semiconductor device formed therein (2) a substrate manufacturing step of manufacturing a substrate with electrode by forming a plurality of wiring electrodes connected to the semiconductor devices respectively formed in the plurality of device regions and extending from the device regions into the inside of the scribe-groove parts, such that the plurality of wiring electrodes are arranged, for each of the plurality of device regions, in a partial arrangement pattern in which the wiring electrodes are arranged along only a part of four boundary sides corresponding to boundaries between each of the device regions and the scribe-groove parts, and extend into the scribe-groove part from only one of two device regions adjacent to each other with the scribe-groove part therebetween (3) a laminating step of laminating a plurality of the substrates with electrode to manufacture a laminated wafer (4) a through hole forming step of forming, for the laminated wafer, a through hole which penetrates the scribe-groove parts of the plurality of substrates with electrode laminated in a laminated direction in which the plurality of substrates with electrode are laminated, and in which a plurality of the wiring electrodes, constituting a laminated electrode group laminated in the laminated direction among the wiring electrodes, appear (5) a through electrode forming step of forming a through electrode in contact with all of the wiring electrodes appearing in the through hole such that the through electrode penetrates all of the plurality of substrates with electrode through the through hole.

In case of the above-described method of manufacturing, it is preferable that in the substrate manufacturing step, the wiring electrode is formed in a shape with an electrode pad having a hole part formed along the laminated direction, and the electrode pad is arranged in the scribe-groove part without a gap formed between the electrode pad and the boundary side.

Further, in case of the above-described method of manufacturing, it is preferable that in the substrate manufacturing step, two boundary sides connected in an L-figure like among the four boundary sides in the device region are set as electrode sides along which the wiring electrodes are arranged and two boundary sides other than the electrode sides are set as electrodeless sides along which the wiring electrodes are not arranged.

Further, in case of the above-described method of manufacturing, it is preferable that in the device region forming step, assuming that a width of a cutting member used in cutting the laminated semiconductor substrate at the scribe-groove part is a cut width and a width of the electrode pad bulging out from the boundary side is a pad width, a width of the scribe-groove part is set not to exceed a size obtained by adding the cut width and the pad width.

Further, the present invention provides a method of manufacturing a laminated chip package, including the step of cutting the laminated semiconductor substrate manufactured by the above-described manufacturing method along the scribe-groove parts to cause resin insulating layers made of an insulating resin to appear in a cut surface to manufacture laminated chip packages.

The present invention will be more fully understood from the detailed description given hereinbelow and the accompanying drawings which are given by way of illustration only, and thus are not to be considered as limiting the present invention.

DETAILED DESCRIPTION OF THE EMBODIMENTS

In the following, embodiments of the present invention will be described with reference to the drawings. Note that the same components will be referred to with the same numerals or letters, while omitting their overlapping descriptions.

First Embodiment (Structure of Laminated Semiconductor Wafer 100)

To begin with, the structure of a laminated semiconductor wafer 100 will be described with reference to FIG. 1 to FIG. 5. The laminated semiconductor wafer 100 is manufactured using a semiconductor wafer 1. The laminated semiconductor wafer 100 is a laminated semiconductor substrate according to a first embodiment of the present invention. In the laminated semiconductor wafer 100, a plurality of semiconductor wafers 1 are laminated. In the laminated semiconductor wafer 100 illustrated in FIG. 1, eight semiconductor wafers 1 are laminated. Since it is sufficient that a plurality of semiconductor substrates are laminated in the laminated semiconductor substrate according to the present invention, the number of the semiconductor wafers 1 which are laminated within the laminated semiconductor wafer 1 is not limited to eight.

Figure 1:
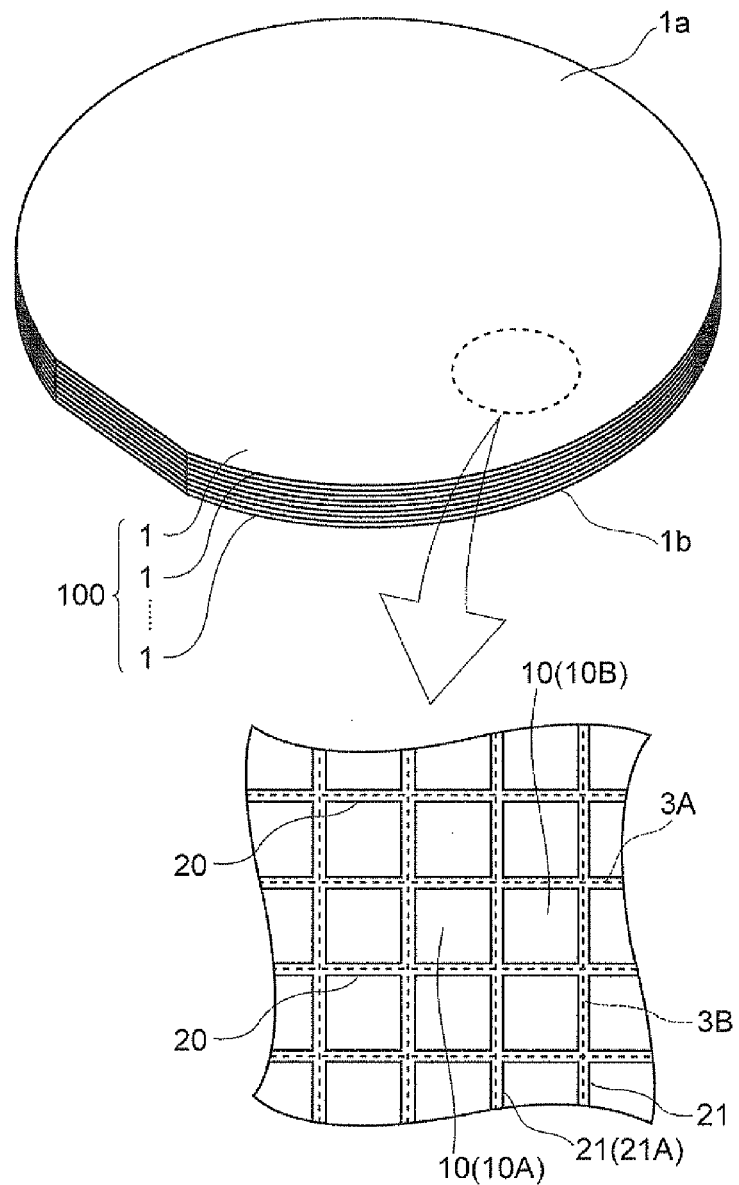
FIG. 1 is a perspective view illustrating the entire laminated semiconductor wafer according to a first embodiment of the present invention.
Figure 2:
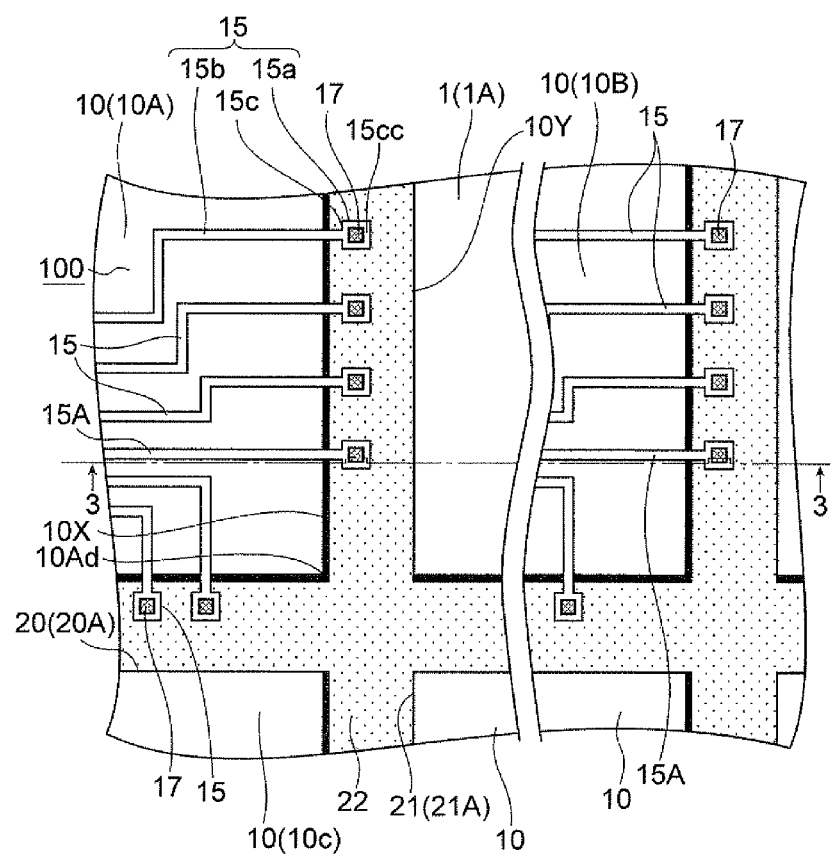
FIG. 2 is a plan view illustrating a principal part of the laminated semiconductor wafer in FIG. 1.
Figure 3:
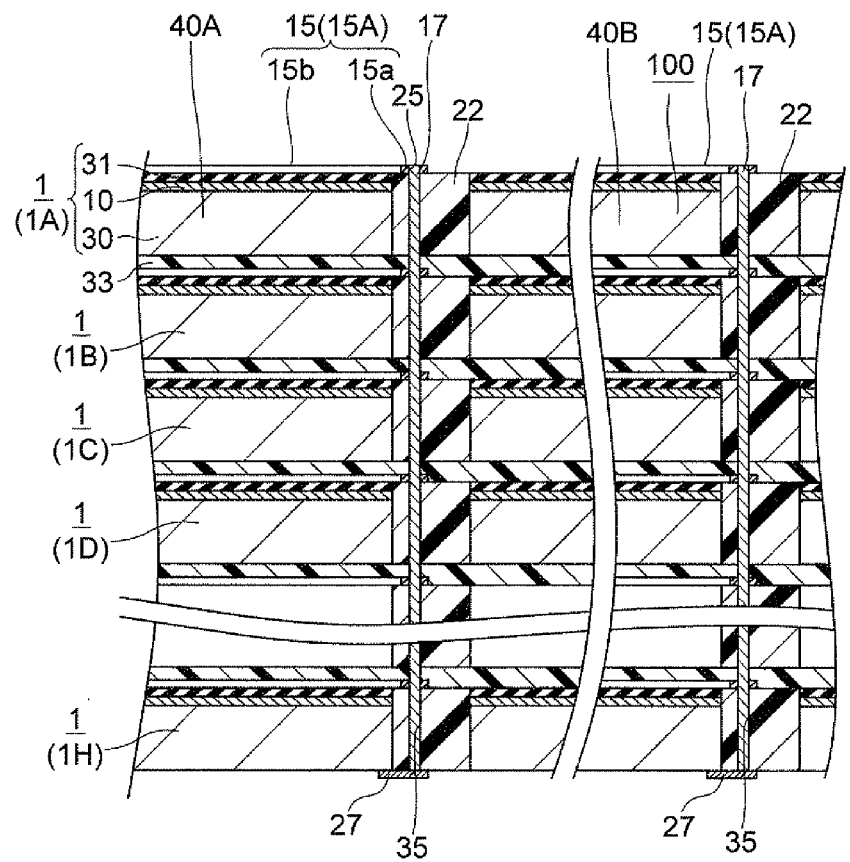
FIG. 3 is a sectional view taken along the line 3-3 in FIG. 2.
Figure 4:
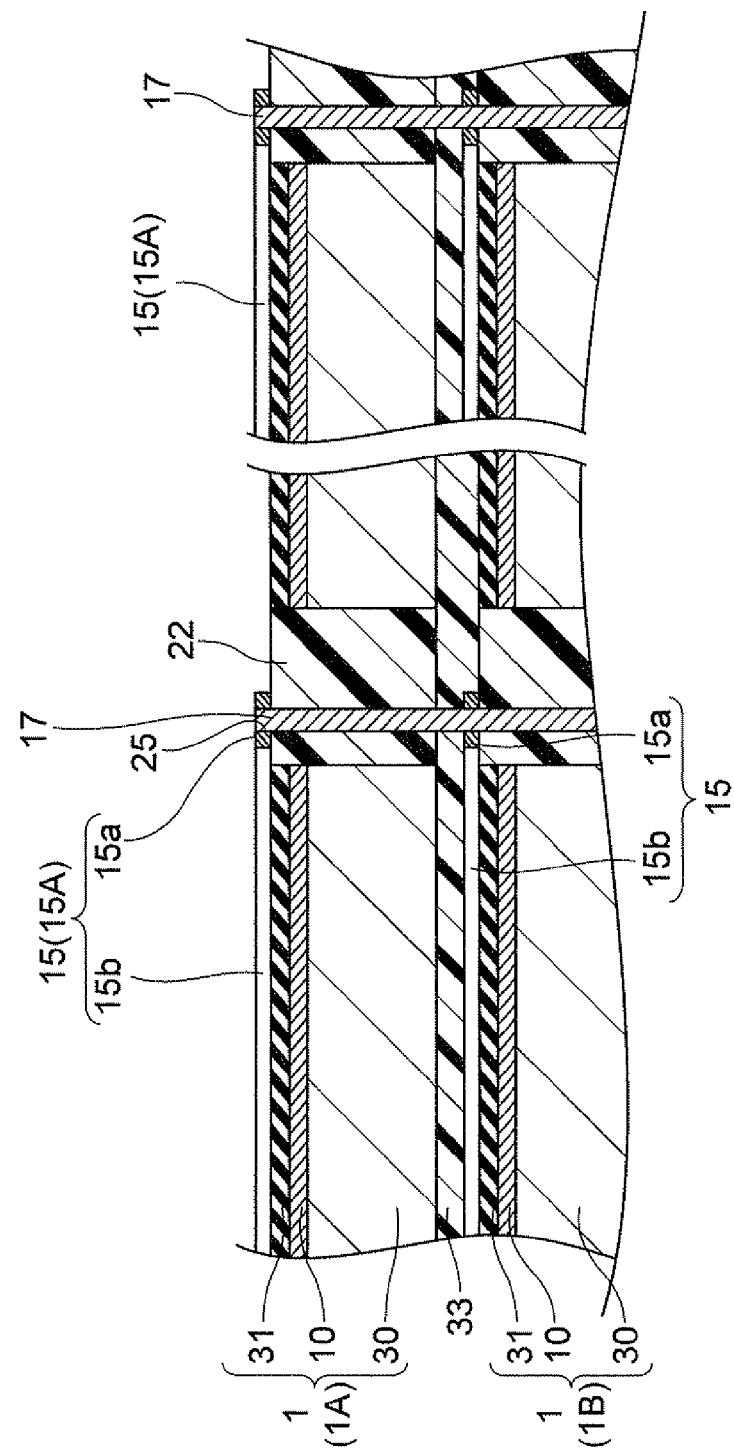
FIG. 4 is a sectional view illustrating a principal part of the laminated semiconductor wafer taken along the line 3-3 in FIG. 2.
Figure 5:
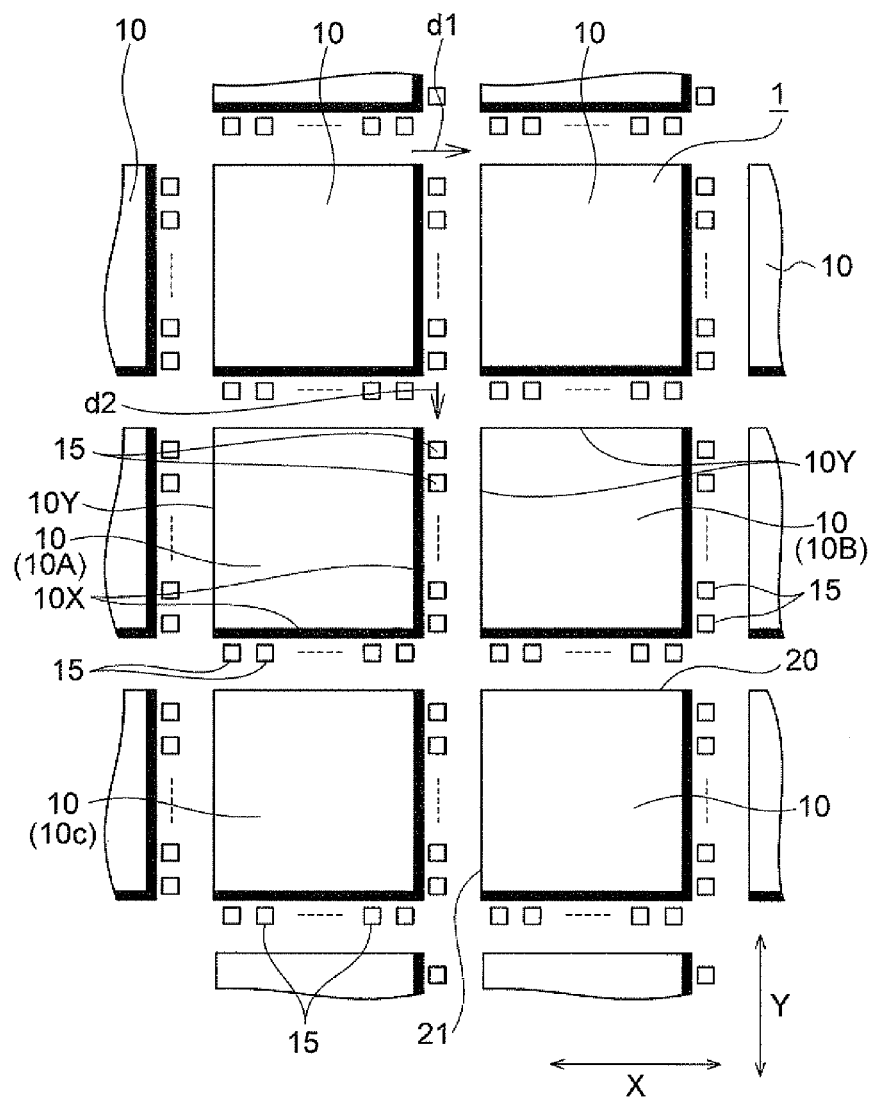
FIG. 5 is a plan view schematically illustrating an arrangement pattern of wiring electrodes in the laminated semiconductor wafer according to the first embodiment of the present invention.

Here, FIG. 1 is a perspective view illustrating the entire laminated semiconductor wafer 100. FIG. 2 is a plan view illustrating a principal part of the laminated semiconductor wafer 100. Besides, FIG. 3 is a sectional view taken along the line 3-3 in FIG. 2, and FIG. 4 is a sectional view illustrating a principal part of the laminated semiconductor wafer 100 taken along the line 3-3 in FIG. 2. FIG. 5 is a plan view schematically illustrating a arrangement pattern of later-described wiring electrodes 15 in the laminated semiconductor wafer 100.

The semiconductor wafer 1 is composed using a silicon wafer. The semiconductor wafer 1 has, as illustrated in FIG. 1, scribe lines 3A and 3B formed on a first surface 1a of the silicon wafer (the rear surface side of the first surface 1a is a second surface 1b). A plurality of each of the scribe lines 3A and 3B are formed on the first surface 1a and formed on straight lines at predetermined intervals along certain directions, respectively. The scribe lines 3A are orthogonal to the scribe lines 3B.

The semiconductor wafer 1 further has groove parts 20 and 21 formed in the first surface 1a. The groove parts 20 and 21 are formed along the scribe lines 3A and 3B, respectively, and each of them has a depth of about 20 to 60 μm and a width of about 35 to 45 μm. The later-described device region 10 is formed within a rectangular region surrounded by the adjacent groove parts 20, 20 and groove parts 21, 21.

Since the groove parts 20, 21 are formed along the scribe lines 3A and 3B, the groove parts 20, 21 have a constitution as a scribe groove part of the present invention. Further, the groove parts 20, 21 are formed as through groove parts which reach the second surface 1b from the first surface 1a. A later-described in-groove insulating layer 22 is formed closely the inside of the groove parts 20, 21.

In FIG. 1, the groove part 20 is formed in the lateral direction and therefor corresponds to a lateral groove part according to this embodiment. The groove part 21 is formed in a longitudinal direction and therefore corresponds to a longitudinal groove part according to this embodiment. In the semiconductor wafer 1, a plurality of scribe-groove parts are formed in a lattice form in which a plurality of groove parts 20 and a plurality of groove parts 21 intersect in a cross shape.

A large number of device regions 10 are formed on the semiconductor wafers 1. In FIG. 1, FIG. 2, one of the plurality of groove parts 21 is set groove part 21A, and adjacent two device regions 10 across the groove part 21A are set device region 10A, 10B.

Figure 14:
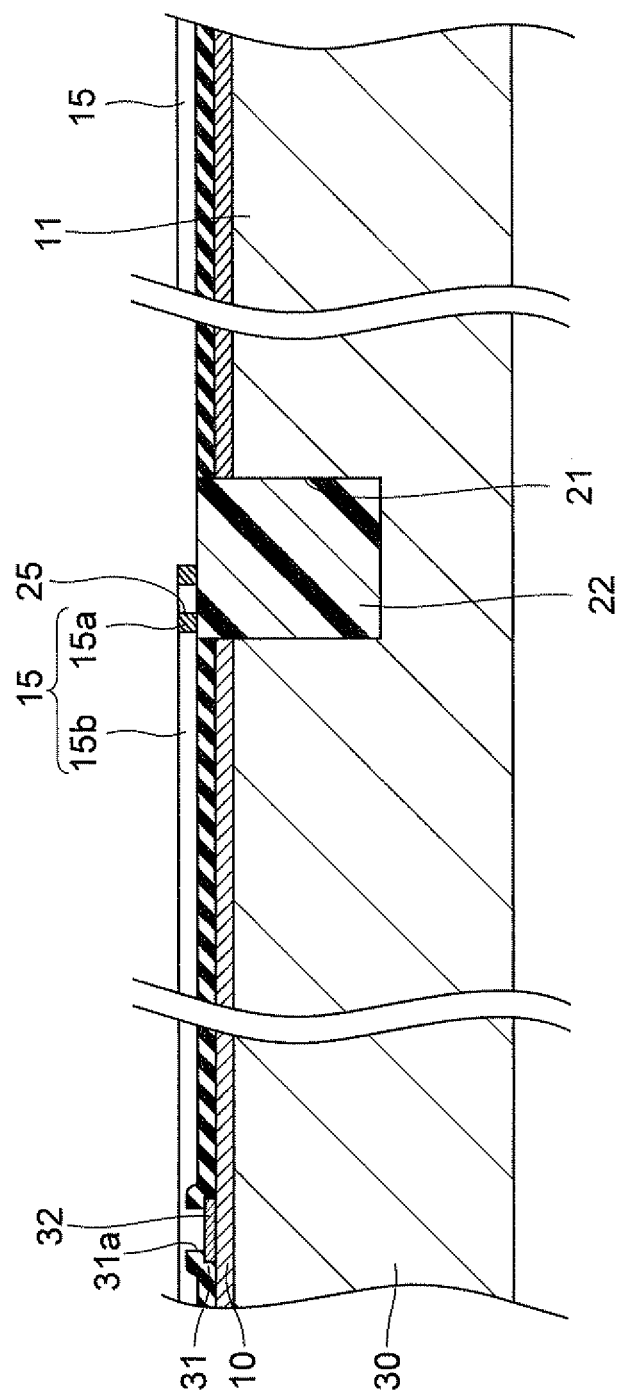
FIG. 14 is a sectional view taken along the line 14-14 in FIG. 12.

The semiconductor wafer 1 has a silicon substrate 30 composed of the silicon wafer, and the device regions 10 are formed in the upper parts of the silicon substrate 30, as illustrated in FIG. 3, FIG. 4. A plurality of connecting pads 32 are formed on the surface of the respective device region 10 as illustrated in FIG. 14 and so on, and a part other than the connecting pads 32 is covered with the protecting insulating layer 31.

The protecting insulating layer 31 is formed to cover the device region 10. The protecting insulating layer 31 is made of silicon dioxide ($SiO_2$) or the like, and has connecting holes 31a formed at positions where the connecting pads 32 are to be formed. The connecting holes 31a are formed to expose the connecting pads 32 so as to connect the later-described wiring electrodes 15 to the connecting pads 32. The connecting pads 32 are connected to the semiconductor device in the device region 10 (see FIG. 10 for details).

Each of the device regions 10 has the memory part formed on the first surface 1a by performing wafer process, and a plurality of wiring electrodes 15 are formed as illustrated in detail in FIG. 2. Each of the device regions 10 is in contact with both of the groove parts 20, 21. Note that the wafer process means a manufacturing process of forming a semiconductor element and an integrated circuit on the semiconductor wafer such as the silicon wafer or the like.

When the above-described one semiconductor wafer 1 is cut at the groove parts 20, 21 along the scribe lines 3A and 3B, a chip-like shape semiconductor piece, surrounded by the in-groove insulating layer 22, mainly comprising the device region 10 and the silicon substrate 30 is obtained. In the semiconductor wafer 1, a part, surrounded by the in-groove insulating layer 22, mainly comprising the device region 10 and the silicon substrate 30 is referred also to as a chip-planned area.

In addition to the memory part, an integrated circuit and a semiconductor element such as a CPU, a sensor, a drive circuit for the sensor may be formed as the semiconductor devices within the device region 10. Further, a memory part and an integrated circuit constituting a controller for controlling the memory part may be formed in the device region 10.

Next, the in-groove insulating layer 22 will be described. The in-groove insulating layer 22 is formed inside of the groove parts 20, 21. In FIG. 2, a surface of the in-groove insulating layer 22 is illustrated in a part with dot.

The in-groove insulating layer 22 is formed using an insulating resin such as an epoxy resin or a polyimide resin, or an insulating material made of silicon silicate glass (SOG) or the like closely filled the inside of the groove parts 20, 21. In this embodiment, a case using a resin for material of the in-groove insulating layer 22 is discussed.

It is especially preferable to form the in-groove insulating layer 22 using a resin having a low thermal expansion coefficient. This ensures that when the semiconductor wafer 1 is cut along the groove parts 20 and 21 by a dicing saw, the cutting can be easily performed.

Besides, since the in-groove insulating layer 22 is formed closely the inside of the groove parts 20, 21, an entire circumference of the respective device regions 10 are surrounded by the in-groove insulating layer 22. The in-groove insulating layer 22 is formed of insulating material. By this in-groove insulating layer 22, adjacent device regions 10 are electrically insulated.

Figure 21:
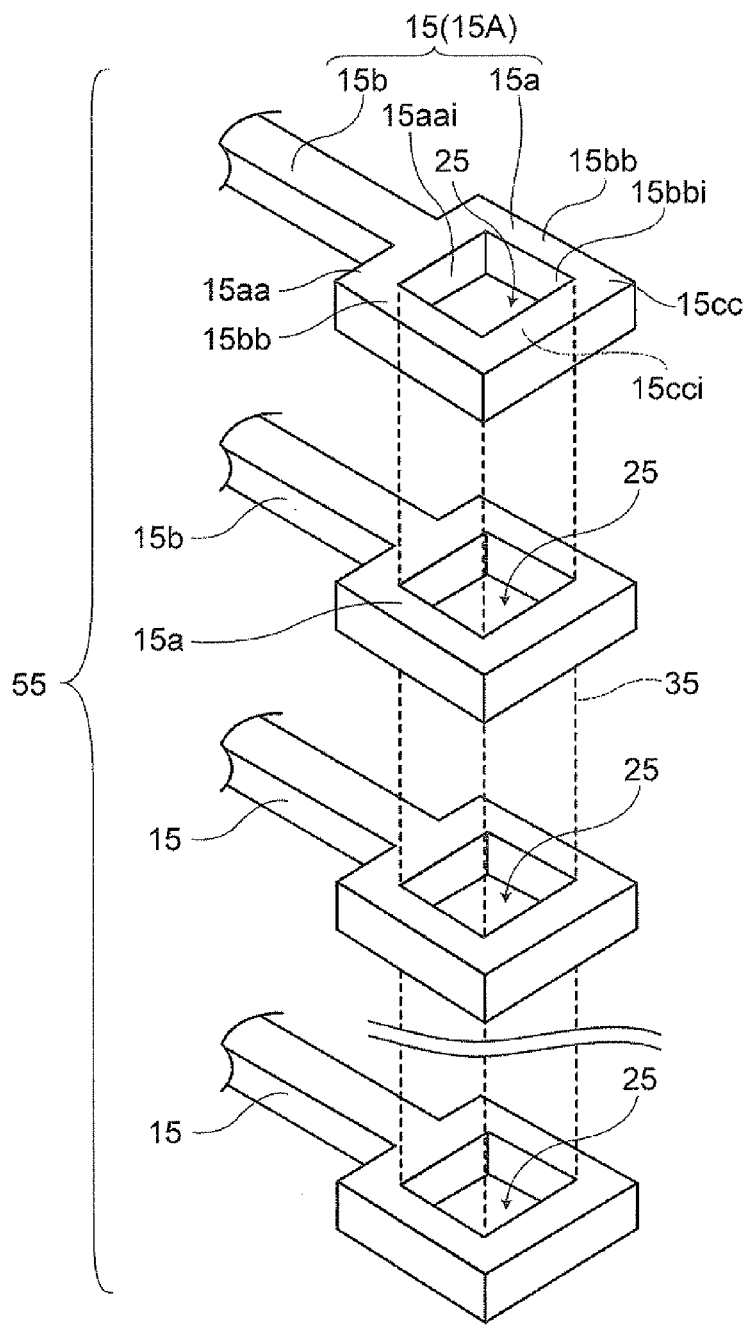
FIG. 21 is a perspective view illustrating a principal part of wiring electrodes stacked with along a laminated direction of the semiconductor wafer among a large number of wiring electrodes formed in the laminated semiconductor wafer in FIG. 1.
Figure 22:
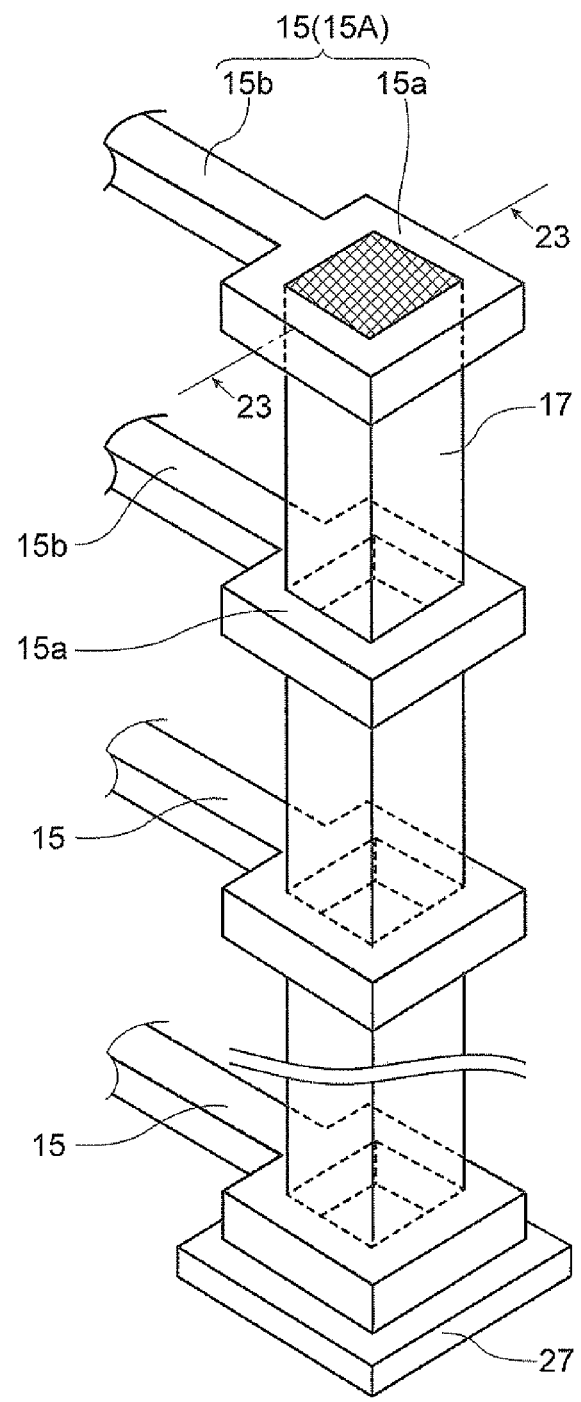
FIG. 22 is a perspective view illustrating a principal part of wiring electrodes, stacked with along a laminated direction of the semiconductor wafer among a large number of wiring electrodes formed in the laminated semiconductor wafer in FIG. 1, and a through electrode.
Figure 23:
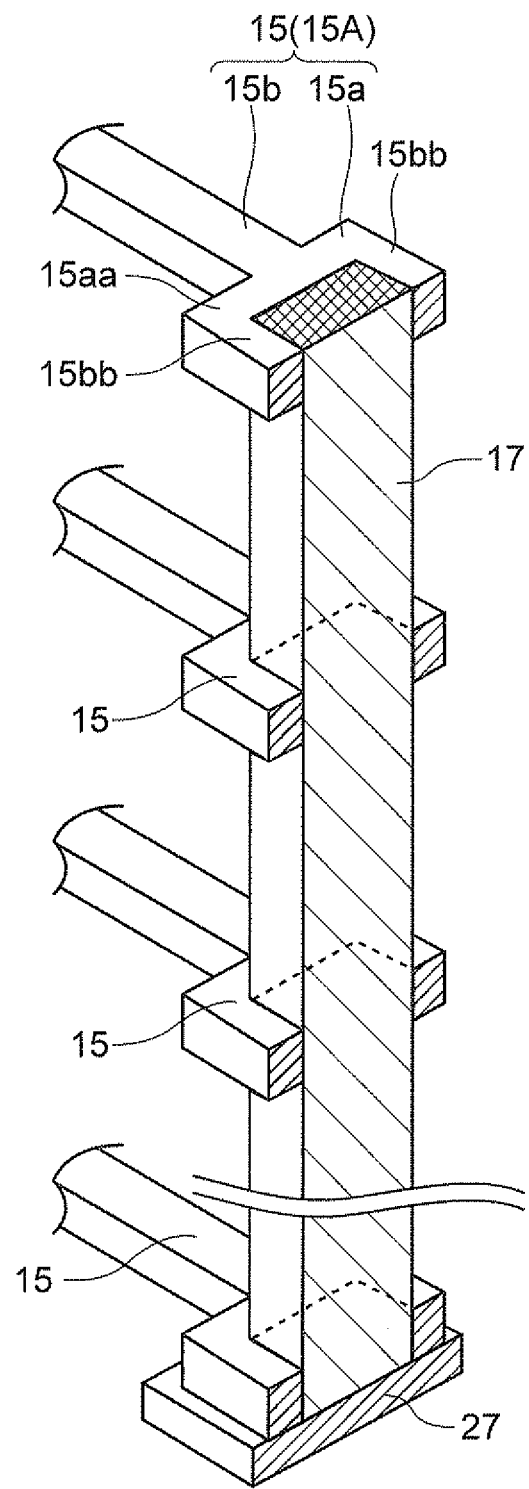
FIG. 23 is a sectional view taken along the line 23-23 in FIG. 22.

Next, wiring electrodes 15 will be described with reference to FIG. 21 to FIG. 23 in addition to FIG. 2 to FIG. 5. Here, FIG. 21 is a perspective view illustrating a principal part of eight wiring electrodes 15 stacked with along a direction which the semiconductor wafers 1 are laminated (hereinafter referred to as a "laminated direction") among a large number of wiring electrodes 15 formed in the laminated semiconductor wafer 100. FIG. 22 is a perspective view illustrating the eight wiring electrodes 15 and a through electrode 17. FIG. 23 is a sectional view taken along the line 23-23 in FIG. 22.

As illustrated in FIG. 2, a plurality of the wiring electrodes 15 are formed along the peripheries of the device regions 10 including the device regions 10A, 10B. Further, parts of the wiring electrodes 15 are formed extending from the respective device regions 10 into the inside of the groove part 20 or the groove part 21. Furthermore, the wiring electrodes 15 extend only from any one of the device regions 10 adjacent to each other with the groove part 20 or the groove part 21 between them into the groove part 20 or the groove part 21. For example, in the case of the device regions 10A, 10B, the wiring electrodes 15 extend from the device region 10A into the groove part 21 (21A) but do not extend from the device region 10B into the groove part 21 (21A). In the case of the device regions 10A, 10C, the wiring electrodes 15 extend from the device region 10A into the groove part 20 (20A) but do not extend from the device region 10C into the groove part 20 (20A).

In this embodiment, assuming that a structure in which wiring electrodes extend from only one of two device regions adjacent to each other with a groove part between them is a single-side extending structure, the wiring electrodes 15 are formed in the single-side extending structure in all parts which are sandwiched by the two device regions 10, among all of the groove parts 20, 21, in the semiconductor wafer 1.

Further, the wiring electrodes 15 are formed not in contact with each other but separated from each other at a predetermined interval. Further, each wiring electrode 15 is electrically insulated.

Further, the plurality of wiring electrodes 15 are arranged in a partial arrangement pattern around each device region 10. The partial arrangement pattern means a pattern in which the wiring electrodes 15 are arranged along only a part of four boundary sides of each device region 10, for example, a pattern as illustrated in FIG. 5. Each device region 10 has four boundary sides 10X, 10X, 10Y, 10Y as illustrated in FIG. 5, and the wiring electrodes 15 are arranged along only the boundary sides 10X, 10X which are a part of them.

The boundary side is a part corresponding to the boundary between the device region and the groove part. The boundary sides 10X, 10Y correspond to the boundaries between the device region 10 and the groove parts 20, 21. Since the device region 10 is formed in a rectangular shape, four boundary sides 10X, 10X, 10Y, 10Y exist at each device region 10. In FIG. 5, thick lines surrounding the device region 10 represent the boundary sides 10X, and thin lines surrounding the device region 10 represent the boundary sides 10Y. Further, the boundary side 10X along which the wiring electrodes 15 are arranged corresponds to an electrode side. The boundary side 10Y along which the wiring electrodes 15 are not arranged corresponds to an electrodeless side. In other words, in the laminated semiconductor wafer 100 (also in the semiconductor wafer 1), the boundary side 10X is set as the electrode side, and the boundary side 10Y is set as the electrodeless side.

Further, the boundary sides 10X, 10X correspond to two sides connected in an L-figure like among the four boundary sides. The boundary sides 10Y, 10Y correspond to two sides other than the boundary sides 10X, 10X. Since the wiring electrodes 15 are arranged in the L-figure like around the device regions 10 in the laminated semiconductor wafer 100 (also in the semiconductor wafer 1), the wiring electrodes 15 are arranged in an L-figure like pattern. In the laminated semiconductor wafer 100 (also in the semiconductor wafer 1), the partial arrangement pattern is the L-figure like pattern.

It is assumed that the directions in which the wiring electrodes 15 extend into the groove parts 20, 21 are extending directions, the extending directions and the partial arrangement pattern are common in all of the plurality of device regions 10 in the laminated semiconductor wafer 100 (also in the semiconductor wafer 1).

As illustrated in FIG. 5, the wiring electrodes 15 extend in an extending direction d1 rightward from the device regions 10 into the groove parts 21 and extend in an extending direction d2 downward from the device regions 10 into the groove parts 20. The extending directions d1, d2 are common in all of the regions 10. Such an L-figure like pattern of the wiring electrodes 15 is common in all of the device regions 10.

Meanwhile, the wiring electrodes 15 are made of a conductive material such as Cu, Au or the like. The wiring electrodes 15 have electrode pads 15a and line-shape terminal parts 15b, respectively. Further, parts of the line-shape terminal parts 15b extending to the innermost of the groove part 21A are tip parts 15c, and the electrode pads 15a are connected to the tip parts 15c.

The electrode pad 15a is in a rectangular shape. Further, the electrode pad 15a is formed such that its width along the length direction (the top-down direction in FIG. 2) of the groove part 21A is wider than that of the line-shape terminal part 15b. The front surface of the electrode pad 15a is flat. The side surface of the electrode pad 15a is also flat.

The electrode pads 15a have later-described extended terminal parts 15cc. A side surface part on the outer side of the extended terminal part 15cc illustrated in FIG. 21 is a part extending to the innermost of the groove part 21A. The side surface part on the outer side of the extended terminal part 15cc has a constitution as an endmost part.

Beside, the electrode pad 15a has a hole part 25 formed at the center thereof as illustrated in detail in FIG. 21. The hole part 25 penetrates from the front side to the rear side of the electrode pad 15a along the width direction of the semiconductor wafer 1, namely, the laminated direction. The electrode pad 15a has a base part 15aa and two crossing parts 15bb in addition to the extended terminal part 15cc. The base part 15aa, the two crossing parts 15bb, and the extended terminal part 15cc surround the periphery of the hole part 25. Therefore, the electrode pad 15a is formed in a rectangular ring shape.

The base part 15aa is a part that is connected to the line-shape terminal part 15b and wider than the line-shape terminal part 15b. The two crossing parts 15bb are parts that are connected to the base part 15aa and extend in a direction crossing the base part 15aa from the base part 15aa. The extended terminal part 15cc is a part that is connected to the two crossing parts 15bb and extends farthest in the electrode pad 15a. Besides, inner side surfaces of the base part 15aa, the two crossing parts 15bb and the extended terminal part 15cc facing the hole part 25 are an inner surface 15aai, two inner surfaces 15bbi, and an inner surface 15cci, respectively. All parts of these inner surfaces appear in a later-described through hole 35.

The line-shape terminal parts 15b are line-shape parts leading from the electrode pads 15a to the connecting pads 32.

The laminated semiconductor wafer 100 has a structure such that the above-described semiconductor wafers 1 are bonded together with an insulating adhesive to be laminated one on the other. In the laminated semiconductor wafer 100, as illustrated in FIG. 3, eight identical semiconductor wafers 1A, 1B, 1C, 1D . . . and 1H are laminated. Incidentally, illustration of the semiconductor wafers 1E to 1G is omitted in FIG. 3.

The laminated semiconductor wafer 100 has laminated chip regions 40A, 40B. The laminated chip regions 40A, 40B include respective eight device regions 10A, 10B laminated in the laminated direction in the semiconductor wafers 1A to 1H. The laminated chip regions 40A, 40B are regions that are insulated from each other by the in-groove insulating layers 22 and later-described adhesive layers 33 and will be later-described discrete laminated chip packages 200, respectively. When the laminated semiconductor wafer 100 is cut along the groove parts 20, 21, the laminated chip regions 40A, 40B are separated to form a plurality of laminated chip packages 200 (described later in detail).

Further, in the laminated semiconductor wafer 100, through holes 35 are formed as illustrated in detail in FIG. 3. The through holes 35 are formed for the respective electrode pads 15a. Therefore, a plurality of through holes 35 are formed in the laminated semiconductor wafer 100. One through electrode 17 is formed inside each through hole 35, respectively. Further, electrode pads 27 are formed on the semiconductor wafer 1H side of the laminated semiconductor wafer 100. The electrode pads 27 are connected to the through electrodes 17, respectively.

Each of the semiconductor wafers 1A to 1H has the identical device regions 10A, 10B, in-groove insulating layer 22, wiring electrodes 15 and so on. When the laminated semiconductor wafer 100 is seen in the laminated direction, eight electrode pads 15a are arranged along the respective through holes 35. The illustration of the relation between the through hole 35 and the electrode pads 15a is, for example, as illustrated in FIG. 21

Further, the eight wiring electrodes 15 along the respective through holes 35 have common positions in the semiconductor wafers 1A to 1H. For example, all of the wiring electrodes 15A in the respective semiconductor wafers 1A, 1B, 1C, 1D . . . and 1H are formed in the device regions 10A and formed at positions having the identical positional relation with the corner parts 10Ad. These electrode pads 15a are arranged in a straight line along the through hole 35.

Here, it is assumed that the wiring electrodes 15 having common positions among the wiring electrodes 15 in the respective semiconductor wafers 1A to 1H are common wiring electrodes. In the laminated semiconductor wafer 100, the common wiring electrodes are arranged in a straight line along the laminated direction. For example, the eight wiring electrodes 15A in total in the respective semiconductor wafers 1A, 1B, 1C, 1D . . . and 1H are the common wiring electrodes. The wiring electrodes 15A being identical wiring electrodes 15 constitute a laminated electrode group 55 illustrated in FIG. 21. The laminated electrode group 55 is composed of a plurality of wiring electrodes 15 laminated in the laminated direction.

The through hole 35 is formed in a straight line connecting, along the laminated direction, all of the hole parts 25 formed in the respective electrode pads 15a of the eight wiring electrodes 15 constituting the laminated electrode group 55. Further, the through hole 35 penetrates the groove parts 20, 21, the in-groove insulating layers 22, and the adhesive layers 33 of the semiconductor wafers 1A to 1H as illustrated in FIG. 3. This is resulted from that the electrode pads 15a extend to the insides of the groove parts 20, 21, the in-groove insulating layers 22 are formed inside the groove parts 20, 21, and the adhesive layers 33 are formed between the semiconductor wafers 1A to 1H.

The whole inner surfaces, facing the hole parts 25, of the eight electrode pads 15a constituting the respective laminated electrode groups 55 appear in the through holes 35. In other words, all of the whole parts of the inner surface 15aai, two inner surfaces 15bbi, and inner surface 15cci of the respective electrode pads 15a appear in the through hole 35 as illustrated in FIG. 21. Further, the through electrodes 17 are formed inside the above-described through holes 35. Therefore, the whole inner surfaces, facing the hole parts 25, of all of the eight electrode pads 15a constituting the laminated electrode group 55 are individually in direct contact with the peripheral surface of the through electrode 17 as illustrated in FIG. 22, FIG. 23.

The through electrodes 17 penetrate all of the semiconductor wafers 1A to 1H passing through the inside of the through holes 35. Further, the through electrode 17 is formed in a straight one-bar shape. The through electrode 17 is a one conductor without joint. Rectangular parts with mesh in FIG. 2 indicate the front surfaces of the through electrodes 17. The through electrodes 17 are made of a metal member such as Cu, Au or the like. The through electrodes 17 are in direct contact with the eight electrode pads 15a appearing in the through holes 35. Since the whole inner surfaces of the respective eight electrode pads 15a appear in the through holes 35 as describe above, the through electrodes 17 are in contact with the whole inner surfaces of the eight electrode pads 15a, respectively.

Figure 10:
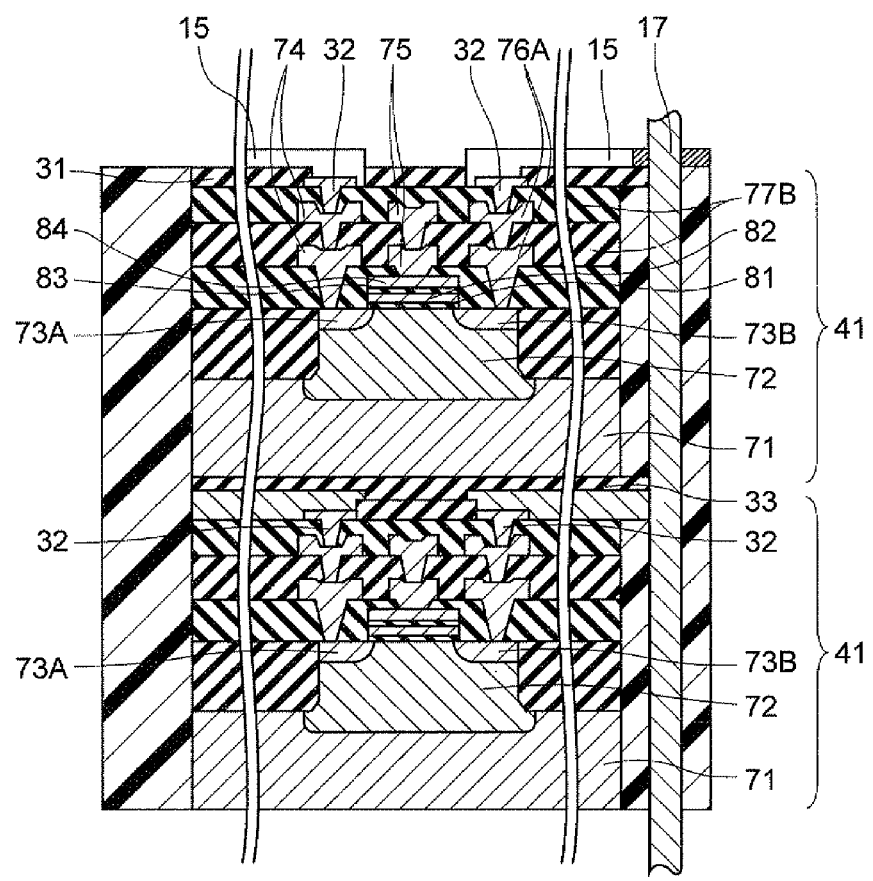
FIG. 10 is a sectional view mainly illustrating memory cells of a laminated semiconductor wafer in FIG. 1.

Meanwhile in the memory part of the device region 10, a number of memory cells 41 as the semiconductor devices are formed. The memory cell 41 has a structure as illustrated in FIG. 10. FIG. 10 is a sectional view mainly illustrating memory cells 41 of a laminated semiconductor wafer 100.

To the memory cell 41, the wiring electrodes 15 are connected via the connecting pads 32. The memory cell 41 is formed on the surface of an N-type substrate 71 constituting the semiconductor wafer 1. In FIG. 10, two memory cells 41 are laminated one on the other via an adhesive layer 33. The adhesive layer 33 is formed by an adhesive used when the semiconductor wafers 1 are bonded together.

Each of the memory cells 41 constitutes a flash memory and is formed on a P-type well 72 which is formed on the surface of the N-type substrate 71. The memory cell 41 has a source 73A and a drain 73B, insulating layers 77B, an insulating film 81, a floating gate 82, an insulating film 83 and a control gate 84. The memory cell 41 further has a source electrode 74, a drain electrode 76A and a gate electrode 75.

Both of the source 73A and the drain 73B are N-type regions and connected with the source electrode 74 and the drain electrode 76A, respectively. The insulating layers 77B are formed with contact holes for connecting the connecting pads 32 to the source electrode 74 and the drain electrode 76A, respectively. The source electrode 74, the gate electrode 75, and the drain electrode 76A are connected to the source 73A, the control gate 84 and the drain 73B via the corresponding contact holes, respectively.

(Operation and Effect of Laminated Semiconductor Wafer 100)

As described above, in the laminated semiconductor wafer 100, a plurality of wiring electrodes 15 are arranged in the partial arrangement pattern around each device region 10. Therefore, there is a part where the wiring electrodes 15 are arranged and a part where the wiring electrodes 15 are not arranged around each device region 10. Further, the wiring electrodes 15 are formed in the single-side extending structure in all of the parts of the groove parts 20, 21 which are sandwiched by two device regions 10. Therefore, it is unnecessary to secure the space enough for two wiring electrodes 15 to be arranged side by side along the width direction inside the groove part 20 or the groove part 21 in the laminated semiconductor wafer 100 (also in the semiconductor wafer 1). Therefore, the widths of the groove parts 20, 21 can be reduced as compared to the case where two wiring electrodes 15 are arranged side by side along the width direction.

When the through electrodes 305, 305 are extended from both sides of the groove parts 303A, 303B as in the above-described conventional semiconductor substrate 300, it is necessary to secure the widths of the groove parts 303A, 303B in sizes to allow the through electrodes 305, 305 to be arranged side by side along the width directions of the groove parts 303A, 303B. In addition, it is necessary that when the groove parts 303A, 303B are cut by a dicing saw, the through electrodes 305, 305 remain without being cut. Therefore, the groove parts 303A, 303B need to be secured in certain sizes, and it is difficult to reduce the widths of the groove parts 303A, 303B.

In contrast, if the wiring electrodes 15 are formed in the single-side extending structure at all of the parts which are sandwiched by two device regions 10 in all of the groove parts 20, 21 as in the laminated semiconductor wafer 100 (also in the semiconductor wafer 1), it is only necessary to secure the widths of all of the groove parts 20 and the groove parts 21 in sizes enough for one wiring electrode 15 to be arranged along the width direction. Therefore, it becomes possible to reduce the widths of all of the groove parts 20 and the groove parts 21.

The reduction in the widths of all of the groove parts 20 and the groove parts 21 leads to an increase of a part in the semiconductor wafer 1 which is able to be allocated to the device regions 10 and thus enables an increase in the number of device regions 10 which can be formed on one semiconductor wafer 1. Therefore, the number of semiconductor chips obtainable from one semiconductor substrate can be increased. When the number of semiconductor chips obtainable from one semiconductor substrate is increased, the number of laminated chip packages which can be manufactured per unit time can be increased, so that the manufacturing cost of the laminated chip package can be reduced.

The wiring electrodes 15 may be formed in the single-side extending structure not in all of the plurality of groove parts 20 and the groove parts 21 but in only a part of them. Also in this case, the number of the device regions 10 which can be formed on one semiconductor wafer 1 can be increased accompanying the reduction in the widths of the groove parts 20 and the groove parts 21. However, the case where the wiring electrodes 15 are formed in the single-side extending structure in all of the groove parts 20 and the groove parts 21 is more preferable because more device regions 10 can be formed.

In addition, the laminated semiconductor wafer 100 and the semiconductor wafer 1 are common in the partial arrangement pattern and the extending directions of the wiring electrodes 15 in all of the plurality of device regions 10. Therefore, in the device regions 10, the wiring electrodes 15 extend at the same places around them and in the same directions. Even when the wiring electrodes 15 are arranged in a single-side wiring structure, if the extending directions thereof are not unified, the wiring electrodes 15 extending leftward and the wiring electrodes 15 extending rightward will be arranged in a mixed manner, for example, in one groove part 20. In such a case, it is necessary to secure the width of the groove part 20 in a size enough for two wiring electrodes 15 to be arranged side by side and it is difficult to reduce the width of the groove part 20. However, the wiring electrodes 15 extend in the same directions in all of the groove parts 20, 21 in the semiconductor wafer 1, the width of the groove parts 20 can be reduced.

Further, it is possible to make the partial arrangement pattern and the extending directions of the wiring electrodes 15 common in all of the device regions 10 by making the partial arrangement pattern of the wiring electrodes 15 in the same L-figure like pattern as in the laminated semiconductor wafer 100 (also in the semiconductor wafer 1).

Meanwhile, in the laminated semiconductor wafer 100, the whole peripheries of the device regions 10A, 10B are surrounded by the in-groove insulating layer 22 and thus insulated from each other. Further, the laminated chip regions 40A, 40B are formed of the eight device regions 10A, 10B laminated in the laminated direction. In the laminated chip regions 40A, 40B, the eight device regions 10 included therein respectively are connected by the wiring electrodes 15 and the through electrodes 17.

Since the laminated semiconductor wafer 100 has the above-described structure, a package inspection is able to be performed for the individual laminated chip package in a state of the wafer structure in which the plurality of semiconductor wafers 1 are laminated, without cutting and physically separating the laminated chip regions 40A, 40B.

In other words, the package inspection only for the laminated chip region 40A is able to be performed by bringing a probe into contact with the electrode pads 15. The laminate chip regions 40A, 40B are regions that will be discrete laminated chip packages 200 respectively, and the package inspection is able to be performed for each of the laminate chip regions 40A, 40B, even in the laminated semiconductor wafer 100. Therefore, in the laminated semiconductor wafer 100, the package inspection for the whole individual laminated chip package is able to be performed in a state of the wafer structure.

Accordingly, the laminated semiconductor wafer 100 has a structure in which the package inspection is easily performed for the whole individual laminated chip packages. The laminated semiconductor wafer 100 is able to be subjected to the package inspection even at a stage of the wafer test before the laminated chip packages are completed. Therefore, the use of the laminated semiconductor wafer 100 enables enhancement of the efficiency of the whole inspection process required for manufacture of the laminated chip packages, resulting in a reduced manufacturing time. Consequently, the laminated semiconductor wafer 100 has a structure with which the number of laminated chip packages manufacturable per unit time can be increased by reducing the manufacturing time.

Further, the laminated chip regions 40A, 40B include sets of wirings for constituting the laminated chip packages 200, such as the wiring electrodes 15, the through electrodes 17 and so on. Therefore, the package inspection reflecting the contact resistance which can occur at connection parts between the wirings can be performed for the laminated semiconductor wafer 100.

Furthermore, the through holes 35 are formed in the laminated semiconductor wafer 100. The through hole 35 is formed in a straight line connecting all of the hole parts 25 of the wiring electrodes 15 constituting the laminated electrode group 55 and is thus very easy to form. Since the through hole 35 is formed in a straight line, the through electrode 17 is a conductor in a one-bar shape and is thus easy to form. Further, the through electrode 17 is a one conductor in a bar shape without joint passing through the respective through hole 35 and thus has a structure in which the contact resistance caused by the contact between conductors for connecting the semiconductor wafers does not occur.

All of the wiring electrodes 15 constituting the laminated electrode group 55 (the inner surfaces of the electrode pads 15a in particular) appear in the through hole 35. Therefore, by filling the inside of the whole through hole 35 with metal such as Cu, Au or the like, the through electrode 17 can be obtained in the form connected to all of the wiring electrodes 15 constituting the laminated electrode group 55. Accordingly, in manufacturing the laminated semiconductor wafer 100, the through electrodes 17 can be easily connected to all of the eight wiring electrodes 15 constituting the laminated electrode groups 55.

The through electrode 17 is completed only by forming one conductor passing through the through hole 35 even though the eight semiconductor wafers 1A to 1H are laminated. Therefore, it is unnecessary to repeat the process of forming the through electrode for each individual semiconductor wafer. Therefore, in the laminated semiconductor wafer 100, the time required for forming the through electrodes can be reduced. Accordingly, the laminated semiconductor wafer 100 has a structure with which the number of laminated chip packages manufacturable per unit time can be further increased by further reducing the manufacturing time.

Further, the through electrode 17 is a one conductor in a bar shape without joint and thus has a contact resistance lower than the contact resistance in the case where the device regions 10 are connected by the through electrodes individually formed in the semiconductor wafers 100.

Meanwhile, the through holes 35 penetrate the hole parts 25 of the respective electrode pads 15a, the in-groove insulating layers 22, and the adhesive layers 33. Parts of the adhesive layers 33 enter the hole parts 25. Therefore, the through holes 35 can be completed by forming holes penetrating only the resin layers (described later for detail). It is unnecessary to form holes penetrating the silicon substrates 30 in order to form the through holes 35. The resin layers are softer than the silicon substrates. Since the through holes 35 are completed by forming the holes penetrating only the resin layers, the formation of the through holes 35 are easily performed by laser beam machining or the like. It takes less labor to form the through holes 35, and it is also possible to reduce the time required for forming the through holes 35. Therefore, the laminated semiconductor wafer 100 has a structure with which the manufacturing time can be further reduced and the number of the laminated chip packages manufacturable per unit time can be further increased.

Besides, the inner surfaces of the electrode pad 15a facing the hole part 25 are four inner surfaces such as the inner surface 15aai, the two inner surfaces 15bbi, and the inner surface 15cci, and the peripheral surface of the through electrode 17 is in direct contact with whole part of all of them. Therefore, a large contact area between the electrode pad 15a and the through electrode 17 is secured. Further, since the electrode pad 15a is in contact with the peripheral surface, in all directions, of the through electrode 17, the current flows more smoothly than the case where the electrode pad 15a is in contact with the peripheral surface in a part of directions.

Furthermore, since the through hole 35 is formed along the hole part 25 of the electrode pad 15a, a hole part on an extension line when the hole part 25 is extended along the laminated direction can be set as the through hole 35. Since such a through hole 35 is easy to form, the time required for forming the through hole 35 can be further reduced.

The through hole 35 penetrates the eight wiring electrodes 15 constituting the laminated electrode group 55. The laminated electrode group 55 is composed of the common wiring electrodes. Therefore, the through hole 35 has a structure capable of connecting the eight electrode pads 15a in the semiconductor wafers 1A to 1H in a shortest distance. Therefore, it take less labor to form the through hole 35 and it is also possible to reduce the time required for forming the through hole 35. Further, the through electrode 17 is in a straight one-bar shape and thus connects the eight electrode pads 15a in a required minimum distance. Accordingly, the metal such as Cu, Au or the like required for forming of the through electrode 17 can also be saved.

Meanwhile, the above-described laminated electrode group 55 is composed of the wiring electrodes 15A being identical common wiring electrodes in all of the eight semiconductor wafers 1A to 1H. The laminated electrode group according to the present invention may be composed of a plurality of kinds of common wiring electrodes. For example, the common wiring electrodes may be different between the four semiconductor wafers 1A to 1D and the four semiconductor wafers 1E to 1H. For example, the wiring electrodes 15A may be used as the common wiring electrodes in the semiconductor wafers 1A to 1D and the wiring electrodes 15 adjacent to the wiring electrodes 15A may be used as the common wiring electrodes in the semiconductor wafers 1E to 1H so that the eight wiring electrodes 15 constitute the laminated electrode group. This constitution requires another electrode between the semiconductor wafer 1D and the semiconductor wafer 1E. Even in this constitution, it is possible to connect all of the eight semiconductor wafers 1A to 1H.

Further, in the above-described semiconductor wafer 100, the eight semiconductor wafers 1A to 1H are laminated. It is also adoptable to use the semiconductor wafer 100 as a unit laminated substrate and laminate a plurality of the unit laminated substrates to form a laminated semiconductor wafer. For example, in the laminated semiconductor wafer in which two unit laminated substrates are laminated, 16 semiconductor wafers are laminated. In three unit laminated substrates, 24 semiconductor wafers are laminated. Accordingly, the number of the semiconductor wafers which are laminated within the laminated semiconductor wafer is a multiple of 8.

Furthermore, it is also adoptable to use the laminated semiconductor wafer in which the four semiconductor wafers 1A to 1D are laminated as a unit laminated substrate, and laminate a plurality of the unit laminated substrates to form a laminated semiconductor wafer. In this case, the number of the semiconductor wafers which are laminated within the laminated semiconductor wafer is a multiple of 4.

When the laminated semiconductor wafer 100 is formed in the above-described unit structure, the number of units according to the capacity of a memory required in the laminated chip package can be easily found. Further, the capacity of the memory in the laminated chip package can be easily varied only by varying the lamination number of unit laminated substrates. For example, when one unit is formed to provide 64 GB, memories of 128 GB and 256 GB can be realized only by varying the lamination number of units. Note that since all multiples of 8 are multiples of 4, it is preferable to laminate the four semiconductor wafers 1A to 1D to form the unit laminated substrate.

(Method of Manufacturing Laminated Semiconductor Wafer 100)

Figure 11:
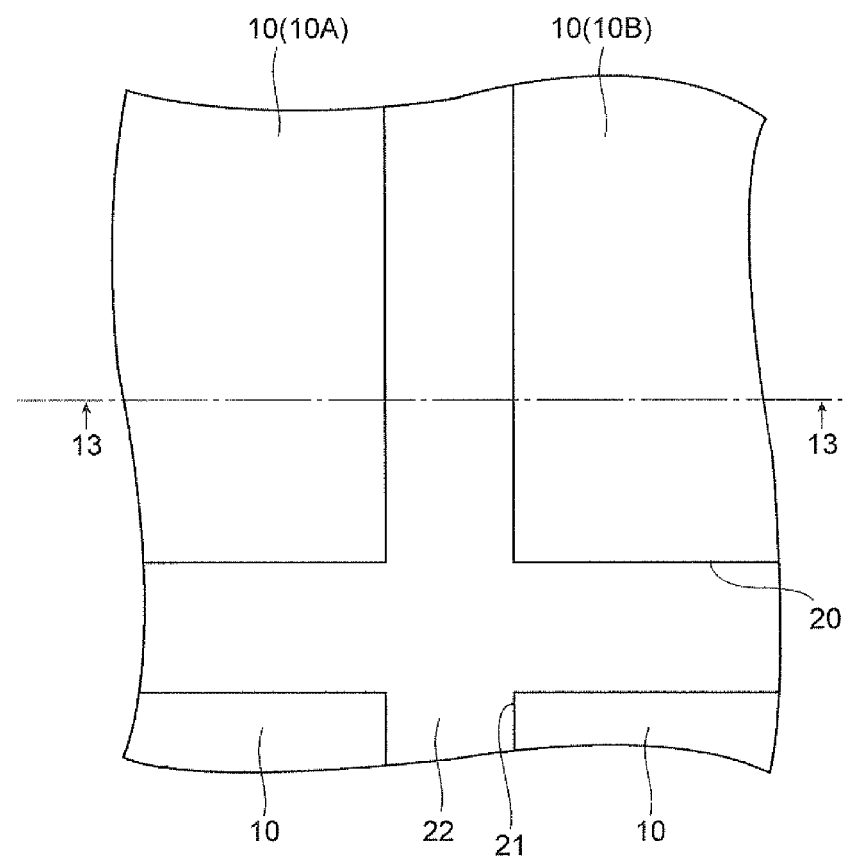
FIG. 11 is a plan view similar to FIG. 2, illustrating the partially manufactured laminated semiconductor wafer.
Figure 12:
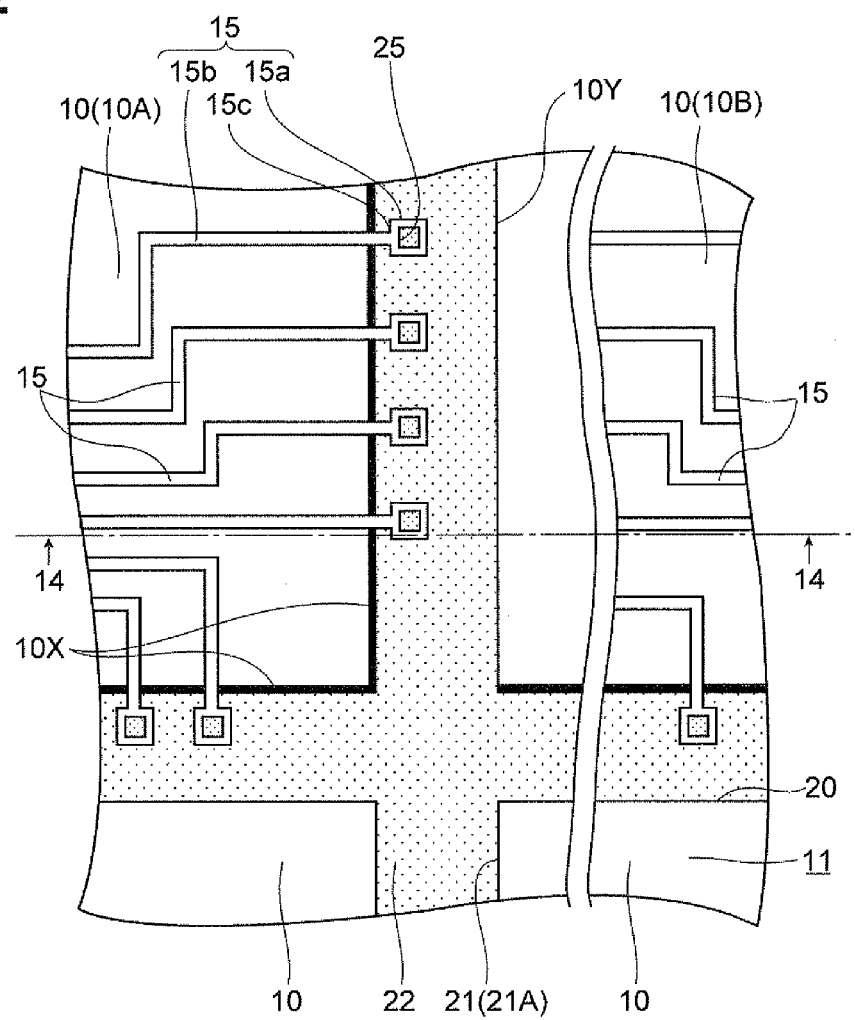
FIG. 12 is a plan view similar to FIG. 2, illustrating the laminated semiconductor wafer subsequent to that in FIG. 11.
Figure 13:
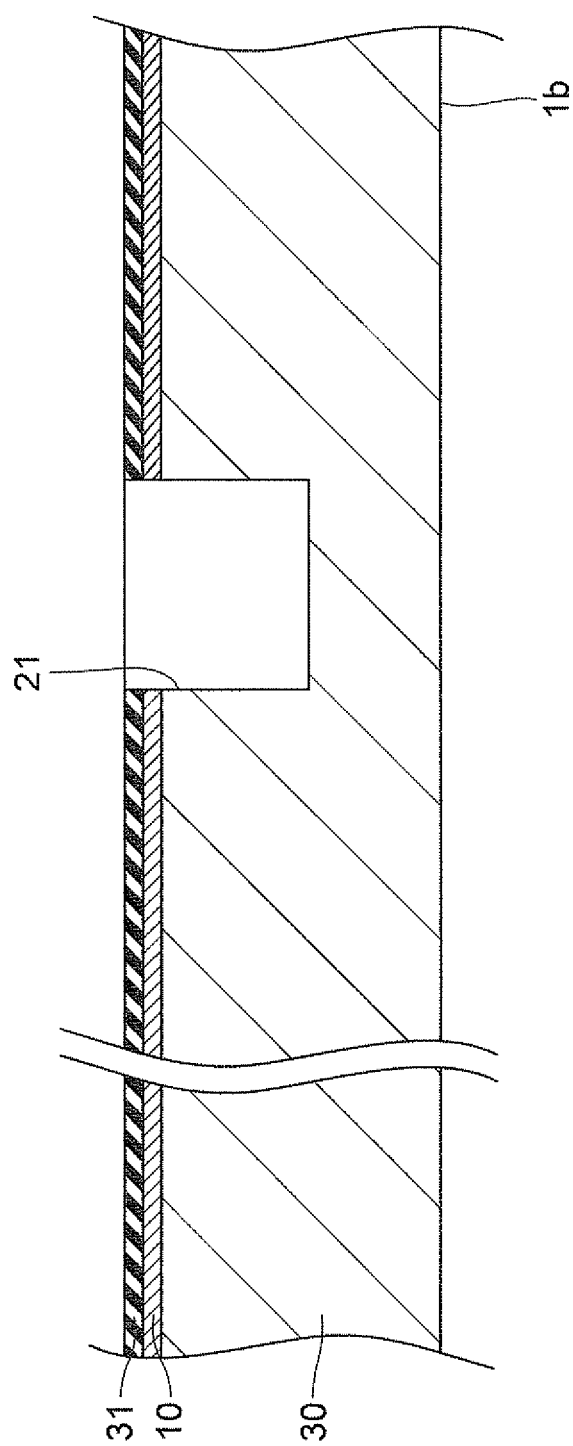
FIG. 13 is a sectional view taken along the line 13-13 in FIG. 11.
Figure 15:
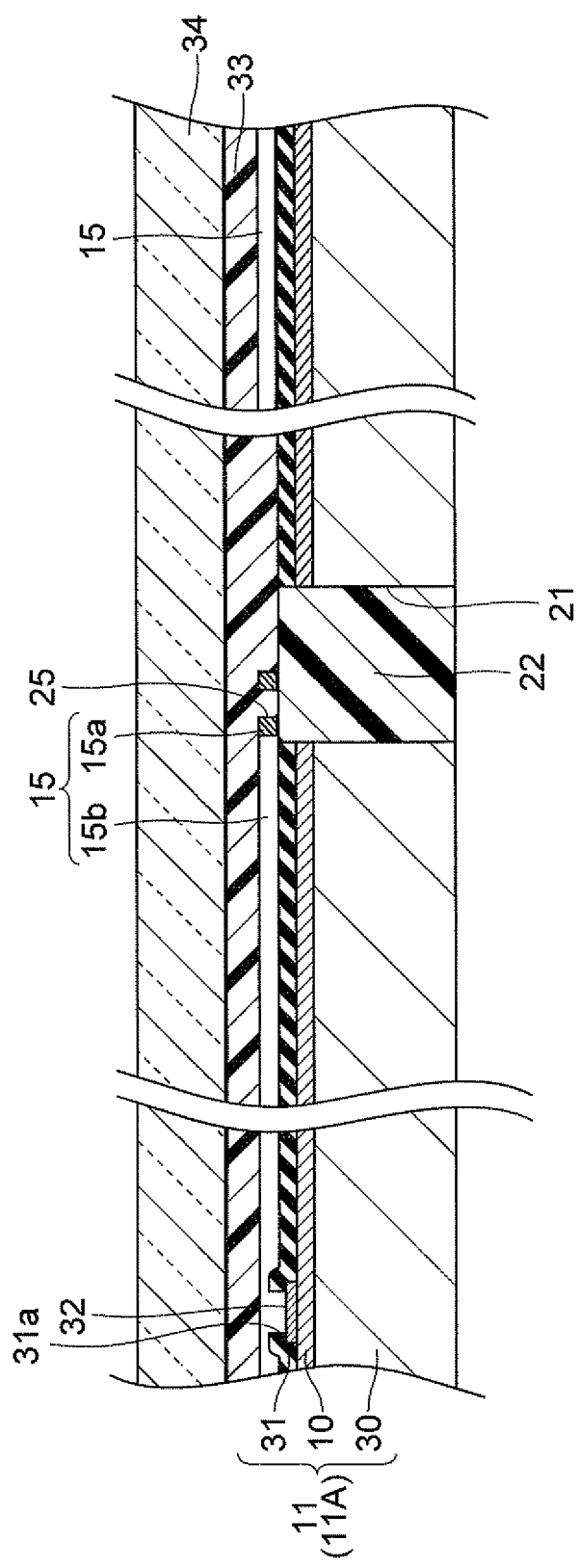
FIG. 15 is a sectional view similar to FIG. 13, illustrating the laminated semiconductor wafer subsequent to that in FIG. 14.

Subsequently, the method of manufacturing the laminated semiconductor wafer 100 having the above-described structure will be described with reference to FIG. 11 to FIG. 20 in addition to FIG. 1 to FIG. 5, FIG. 21 to FIG. 23. Here, FIG. 11 is a plan view similar to FIG. 2, illustrating the partially manufactured laminated semiconductor wafer. FIG. 12 is a plan view similar to FIG. 2, illustrating the laminated semiconductor wafer subsequent to that in FIG. 11. FIG. 13 is a sectional view taken along the line 13-13 in FIG. 11. FIG. 14 is a sectional view taken along the line 14-14 in FIG. 12. Further, FIG. 15 is a sectional view similar to FIG. 13, illustrating the laminated semiconductor wafer subsequent to that in FIG. 14. FIG. 16 to FIG. 20 are sectional views similar to FIG. 12, respectively illustrating the laminated semiconductor wafers subsequent to that in the order.

For manufacturing the laminated semiconductor wafer 100, to begin with, a device region forming process is performed. In the device region forming process, a wafer (unprocessed wafer) is prepared which has memory parts and a plurality of connecting pads 32 formed in the device regions 10 by performing wafer process. Then, the protecting insulating layer 31 is formed on the first surface 1a for the unprocessed wafer, as illustrated in FIG. 13.

Then, the plurality of groove parts 20 and 21 are formed along the scribe lines 3A and 3B. In FIG. 11, the groove part 20 and 21 are illustrated one by one, but the plurality of groove parts 20 and 21 are formed respectively. The groove parts 20 and 21 are able to be formed by the dicing saw, and may be formed by etching such as the reactive ion etching or the like. By forming of the plurality of groove parts 20 and 21 respectively, the plurality of device regions 10 are formed in the unprocessed wafer.

Subsequently, insulating layer forming process is performed. In the insulating layer forming process, an insulating resin, for example, such as an epoxy resin, a polyimide resin or the like is applied to the entire first surface 1a of unprocessed wafer. Then, the applied resin spreads over the entire surface of the unprocessed wafer and further flows into the groove parts 20 and 21. Subsequently, the surface of the unprocessed wafer is polished to be planarized. Thus, the in-groove insulating layer 22 is formed inside the groove parts 20, 21, as illustrated in FIGS. 12, 14. A part flowed into the inside of the groove parts 20, 21 in the applied resin become to the in-groove insulating layer 22.

Next, as illustrated in FIG. 14, the contact holes 31a are formed in the insulating layer 31 to expose the connecting pads 32.

After that, substrate manufacturing process is performed. In this substrate manufacturing process, a substrate with electrode 11 is formed by forming a plurality of wiring electrodes 15 in the respective device regions 10. In this case, the wiring electrodes 15 are formed in the above-described partial arrangement pattern and in the single-side extending structure for all of the device regions 10. In this case, it is preferable to form a plurality of wiring electrodes 15 in the same L-figure like pattern and in common extending directions for all of the device regions 10 as illustrated in FIG. 5 in the substrate manufacturing process.

Further, the wiring electrode 15 is formed in shapes having the electrode pads 15a formed with the hole parts 25. Since the hole parts 25 penetrate the electrode pads 15a, the surface of the in-groove insulating layer 22 is exposed inside the hole parts 25 as illustrated in FIG. 12 (dots are illustrated inside the hole parts 25). The wiring electrodes 15 are able to be formed, for example, in the procedure as follows.

First, a not-shown seed layer for plating is formed on the in-groove insulating layer 22 and the protecting insulating layer 31. Next, a frame (not shown) including groove parts is formed on the seed layer. The frame is formed, for example, by patterning a photoresist by the photolithography. Further, a plating layer which will be parts of the wiring electrodes 15 is formed within the groove parts of the formed frame and on the seed layer. Subsequently, the frame is removed, and a part of the seed layer other than the part which exists under the plating layer is removed by etching. By the above processing, the wiring electrodes 15 are able to be formed of the plating layer and the seed layer thereunder.

Subsequently, laminating process is performed. In the laminating process, later-described laminated wafer 90 is manufactured by laminating of a plurality of substrates with electrode 11 manufactured by the above-described process.

First, as illustrated in FIG. 15, an insulating adhesive is applied on the first surface 1a of the substrate with electrode 11 to fix it to the base 34. In FIG. 15, the adhesive layer 33 made of the adhesive applied at this time is shown. The substrate with electrode 11 is used as the uppermost substrate disposed at the uppermost position of the later-described laminated wafer 90. The base 34 is a member for supporting the substrate with electrode 11, and a glass plate is used for the base 34 in FIG. 15. By applying the adhesive, the adhesive layer 33 is formed on the side of the first surface 1a of the substrate with electrode 11. This adhesive layer 33 is also formed inside the hole part 25.

Subsequently, the second surface 1b of the substrate with electrode 11 is polished until the groove parts 20 and 21 appear so that the thickness of the substrate with electrode 11 is decreased as illustrated in FIG. 15. Then in the substrate with electrode 11, a shape, which only the in-groove insulating layer 22 is arranged just under the hole parts 25, is obtained. Namely, by polishing of the second surface 1b of the substrate with electrode 11 until the groove parts 20 and 21 appear, a part of the silicon substrate 30 disposed under the groove parts 20 and 21 disappear. By this, the groove parts 21 become through groove parts. Accordingly, only resin is arranged, the inside of the hole parts 25, on the extension line along to the laminated direction. Note that the substrate with electrode 11 which the base 34 is fixed is set the substrate with electrode 11A.

Figure 16:
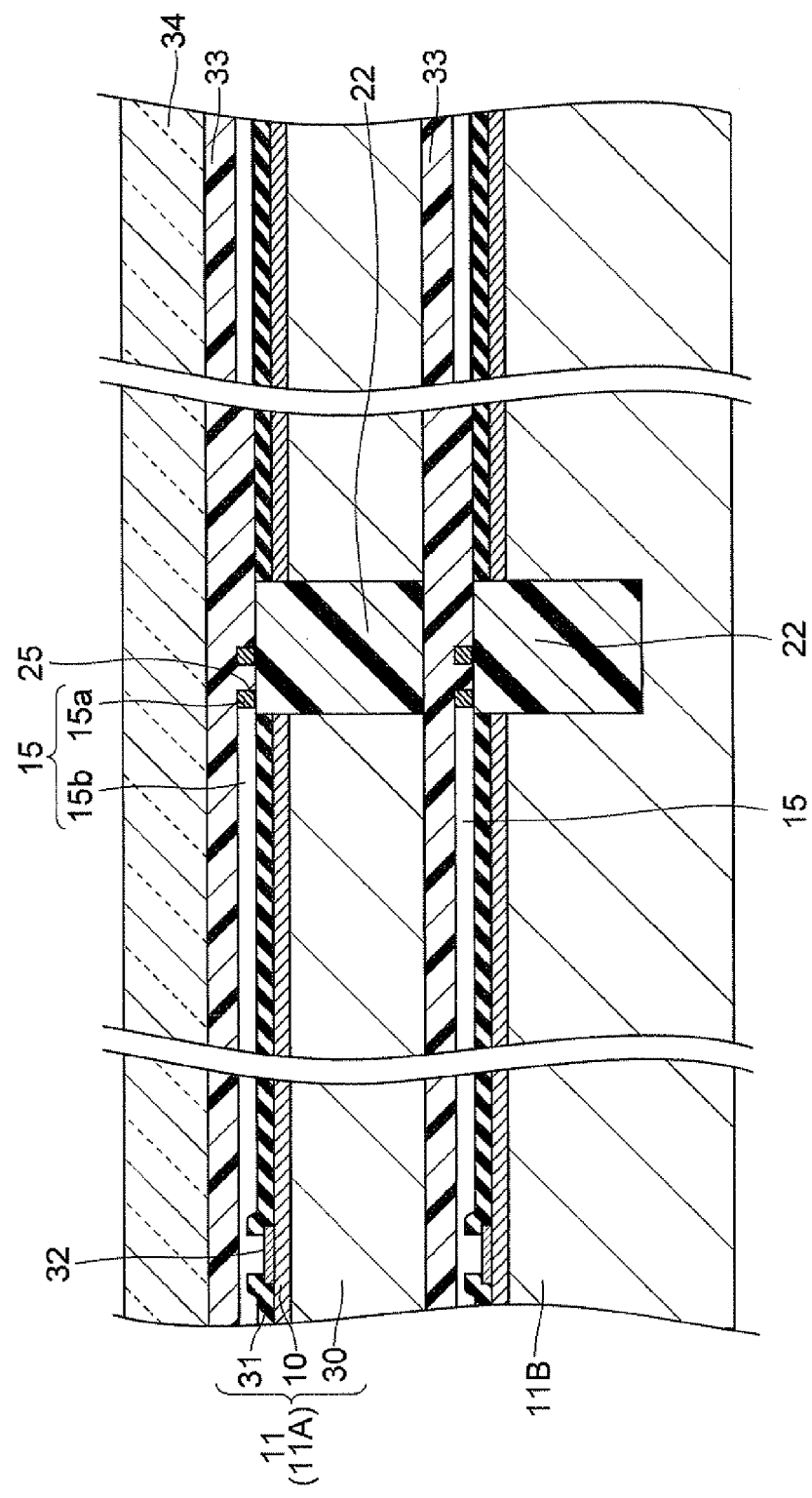
FIG. 16 is a sectional view similar to FIG. 13, illustrating the laminated semiconductor wafer subsequent to that in FIG. 15.

Next, as illustrated in FIG. 16, another substrate with electrode 11B is bonded to the second surface 1b side of the substrate with electrode 11A using an adhesive. In this event, position adjustment of the substrate with electrode 11A and the substrate with electrode 11B is performed such that the positions of the groove parts 20, 21 and the wiring electrode 15 of both of them coincide with each other. Then, the second surface 1b of the substrate with electrode 11B is polished until the groove parts 20 and 21 appear.

Figure 17:
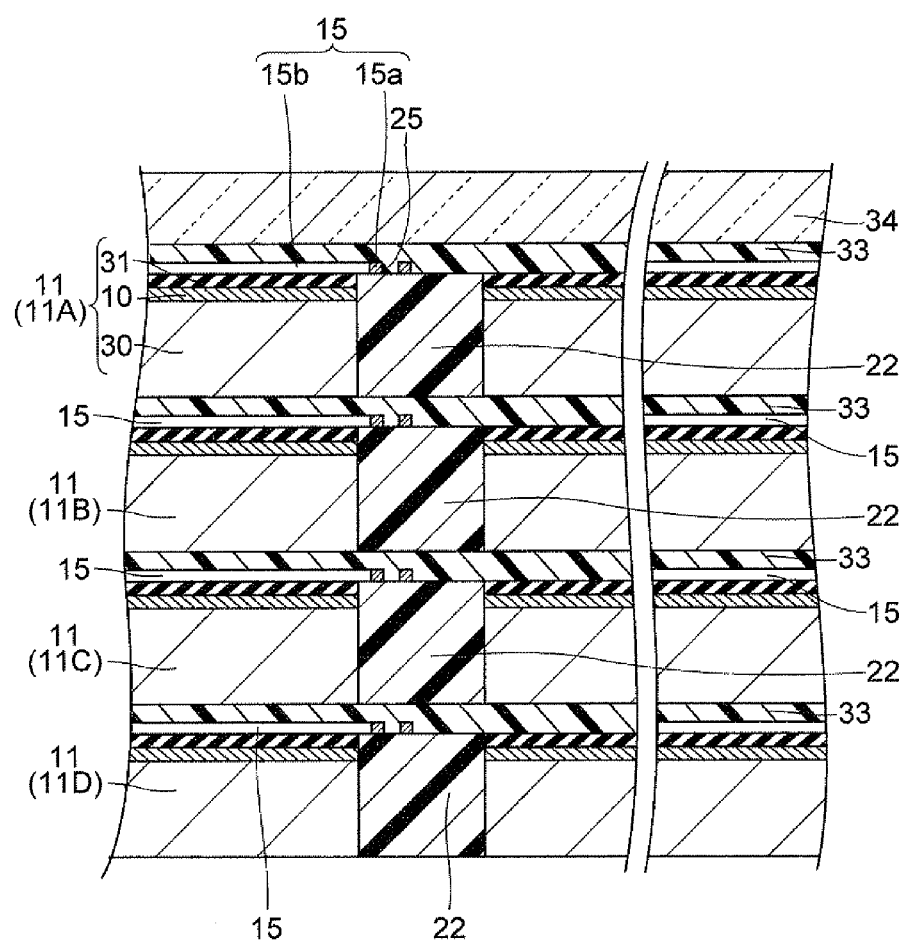
FIG. 17 is a sectional view similar to FIG. 13, illustrating the laminated semiconductor wafer subsequent to that in FIG. 16.

Further, as illustrated in FIG. 17, another substrate with electrode 11C, another substrate with electrode 11D are prepared. Then, for each of the substrates with electrode 11C, 11D, a process of bonding it to the second surface 1b side of the laminated body and polishing it (a bonding and polishing process) is performed.

Figure 18:
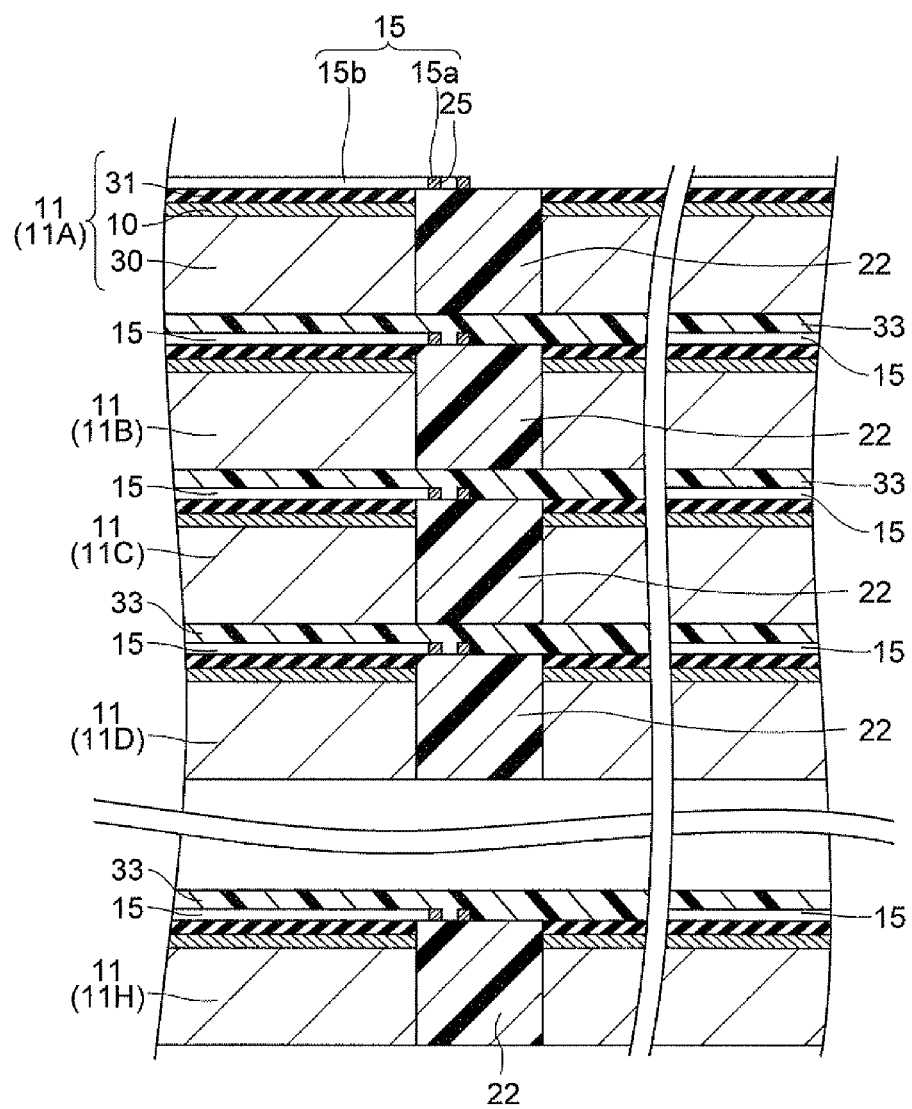
FIG. 18 is a sectional view similar to FIG. 13, illustrating the laminated semiconductor wafer subsequent to that in FIG. 17.
Figure 19:
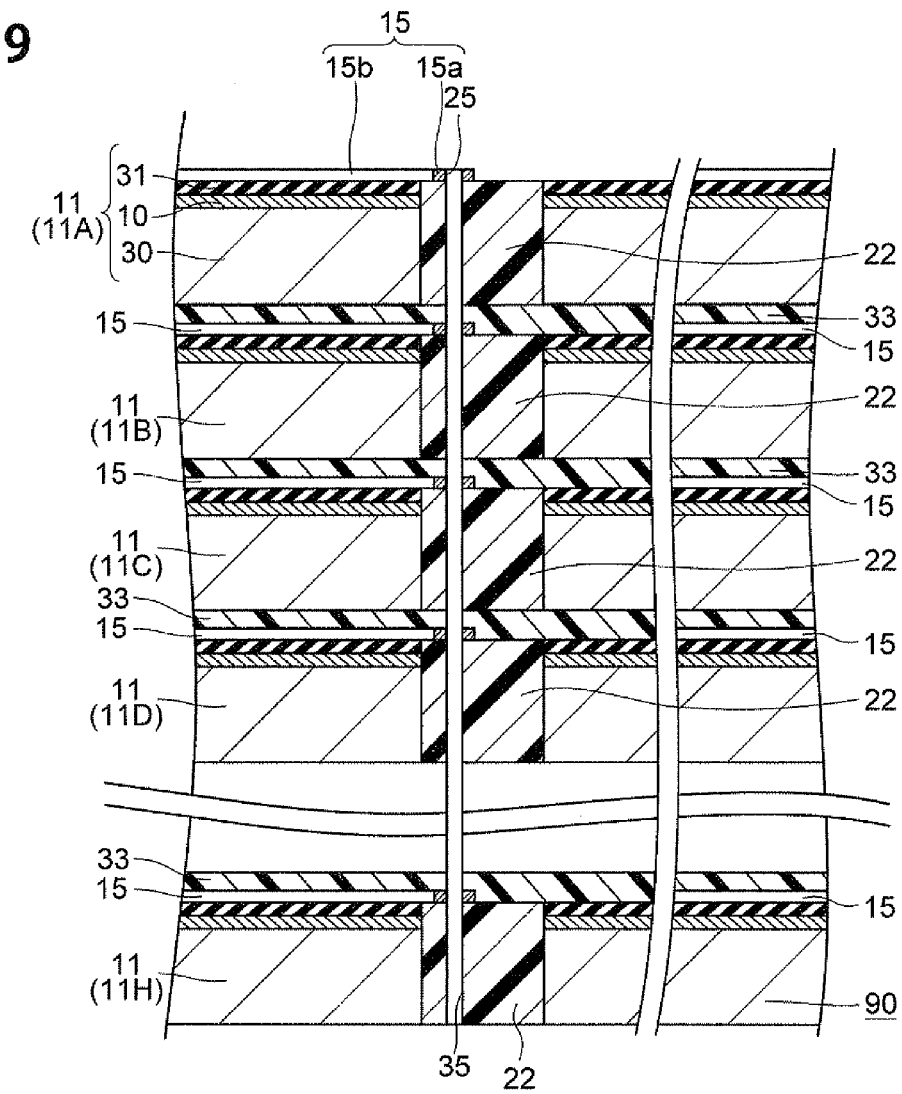
FIG. 19 is a sectional view similar to FIG. 13, illustrating the laminated semiconductor wafer subsequent to that in FIG. 18.
Figure 20:
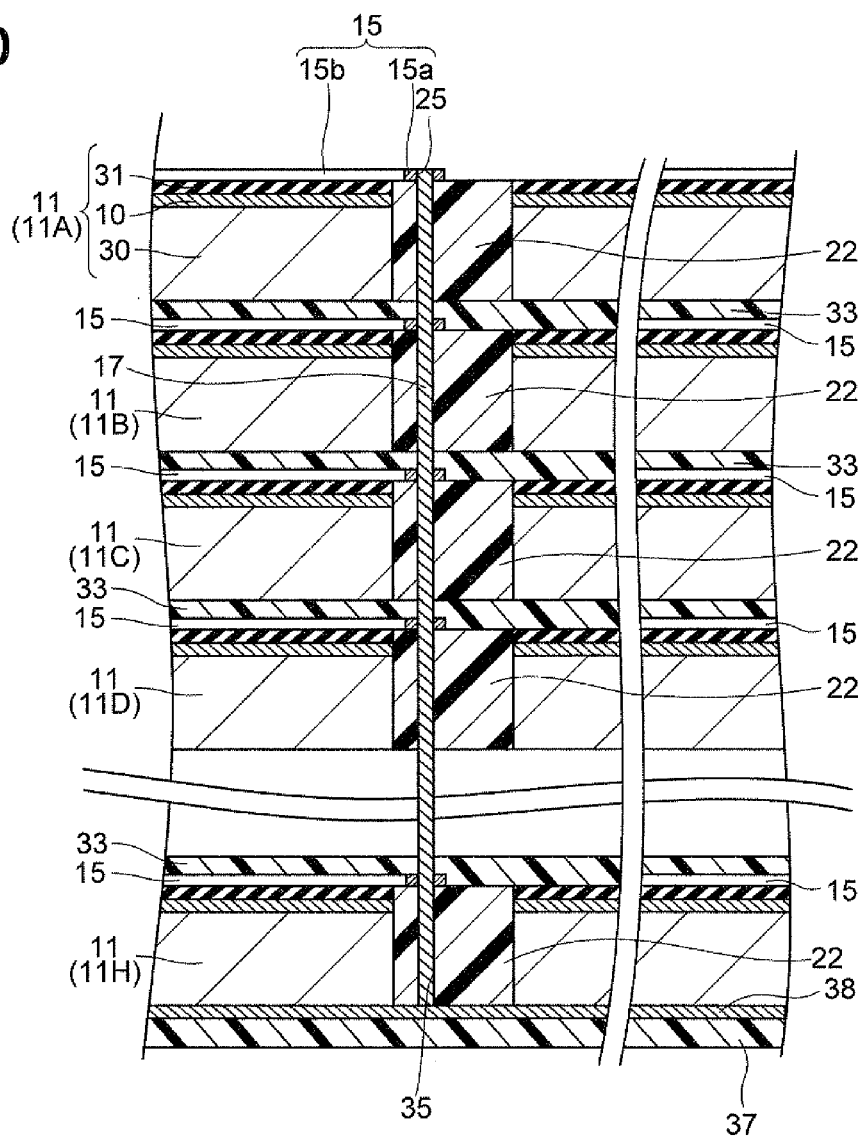
FIG. 20 is a sectional view similar to FIG. 13, illustrating the laminated semiconductor wafer subsequent to that in FIG. 19.

Continuously, as illustrated in FIG. 18, the bonding and polishing process is repeatedly performed for other three substrates with electrode 11 (illustration thereof is omitted in FIG. 18 to FIG. 20). Then, the bonding and polishing process is finally performed for the substrate with electrode 11H. As a result, the bonding and polishing process is performed for the eight substrates with electrode 11 in total.

Thereafter, when the base 34 and the adhesive layer 33 are removed about the substrate with electrode 11A, the laminated wafer 90 as shown in FIG. 19 is manufactured. In the laminated wafer 90, the substrate with electrode 11A is placed at the uppermost position, and the seven substrates with electrode 11 are stacked thereunder, so that the eight substrates with electrode 11 in total are laminated. In this laminated wafer 90, the wiring electrodes 15 of the substrate with electrode 11A appear in the protruding shape because the base 34 and the adhesive layer 33 have been removed.

Next, through hole forming process is performed. In the through hole forming process, as illustrated in FIG. 19, through holes 35 are formed in the laminated wafer 90 manufactured by the above-described process. The through holes 35 are formed in such a manner that the through holes 35 penetrate all of the groove parts 20, 21, the hole parts 25, the in-groove insulating layers 22, and the adhesive layers 33 of the plurality of (eight) substrates with electrode 11 laminated in the direction (the laminated direction) in which the substrates with electrode 11 are laminated, and that the whole inner surfaces of the electrode pads 15a of all of the eight wiring electrodes 15 laminated in the laminated direction appear in the through holes 35.

The through holes 35 are able to be formed, for example, by laser beam machining. In the laser beam machining, the laser beams are focused on a very small area and applied to the hole parts 25 of the wiring electrodes 15. Then, the energy of the applied laser beams melts the in-groove insulating layers 22 and the adhesive layers 33 on extension lines of the hole parts 25 to form the through holes 35 penetrating the in-groove insulating layers 22 and so on in the laminated direction from the regions where the laser beams are applied. To form the through holes 35, the laser beams need to be applied only to the hole parts 25. The laser beam machining is, however, preferable to form the through holes 35 because the machined regions by the laser beam machining are very fine. In this case, in the laser beam machining, $CO_2$ laser (carbon dioxide gas laser) or THG (Third Harmonic Generation) laser can be used. Especially, the THG laser is suitable for machining the resin such as polyimide and the like and is suitable for finely forming the through holes 35.

In addition to the laser beam machining, for example, RIE (Reactive Ion Etching) using oxygen plasma or IBE (Ion Beam Etching) may be applied to form the through holes 35.

Subsequently, a through electrode forming process is executed. In the through electrode forming process, the through electrodes 17 are formed inside the respective through holes 35 formed in the above-described procedure as illustrated in FIG. 20. The through electrode 17 is formed in a one-bar shape which is in contact with the whole inner surfaces of the electrode pads 15a of all of the wiring electrodes 15 appearing in the through hole 35 and penetrates all of the eight substrates with electrode 11 passing through the through hole 35.

The through electrodes 17 can be formed as follows, for instance. As illustrated in FIG. 20, a seed layer 38 is formed on the second surface 1b of the substrate with electrode 11H in the laminated wafer 90 using a holding plate 37 made of resin. The seed layer 38 is made of metal such as Cu or the like and used for forming a plating layer.

Next, electro-plating is performed by passing current through the seed layer 38. Then, a plating film grows from the surface of the seed layer 38 to fill the inside of the through holes 35. Thus, the through electrodes 17 are formed inside the through holes 35. Since the through electrodes 17 are formed by filling the plating film in the through holes 35, the through electrodes 17 come into contact with all of the wiring electrodes 15 appearing in the through holes 35. By forming the through electrodes 17, the device regions 10 laminated in the laminated direction are connected.

Thereafter, electrode pads 27 are formed on the second surface 1b of the substrate with electrode 11H in the laminated wafer 90, the laminated semiconductor wafer 100 is manufactured.

(Structure of Laminated Chip Package)

Figure 6:
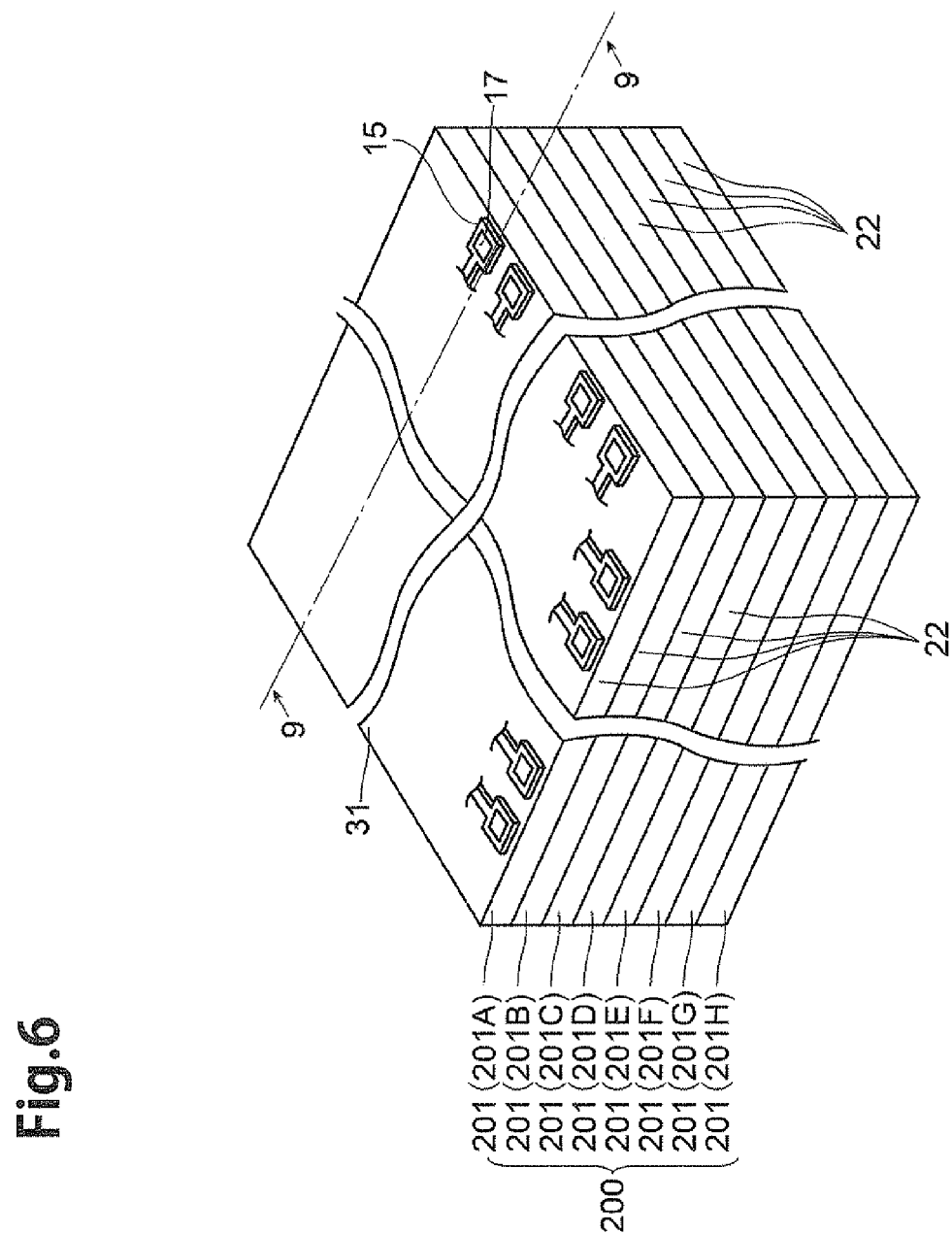
FIG. 6 is a perspective view of a laminated chip package according to the embodiment of the present invention seen from a front side.
Figure 7:
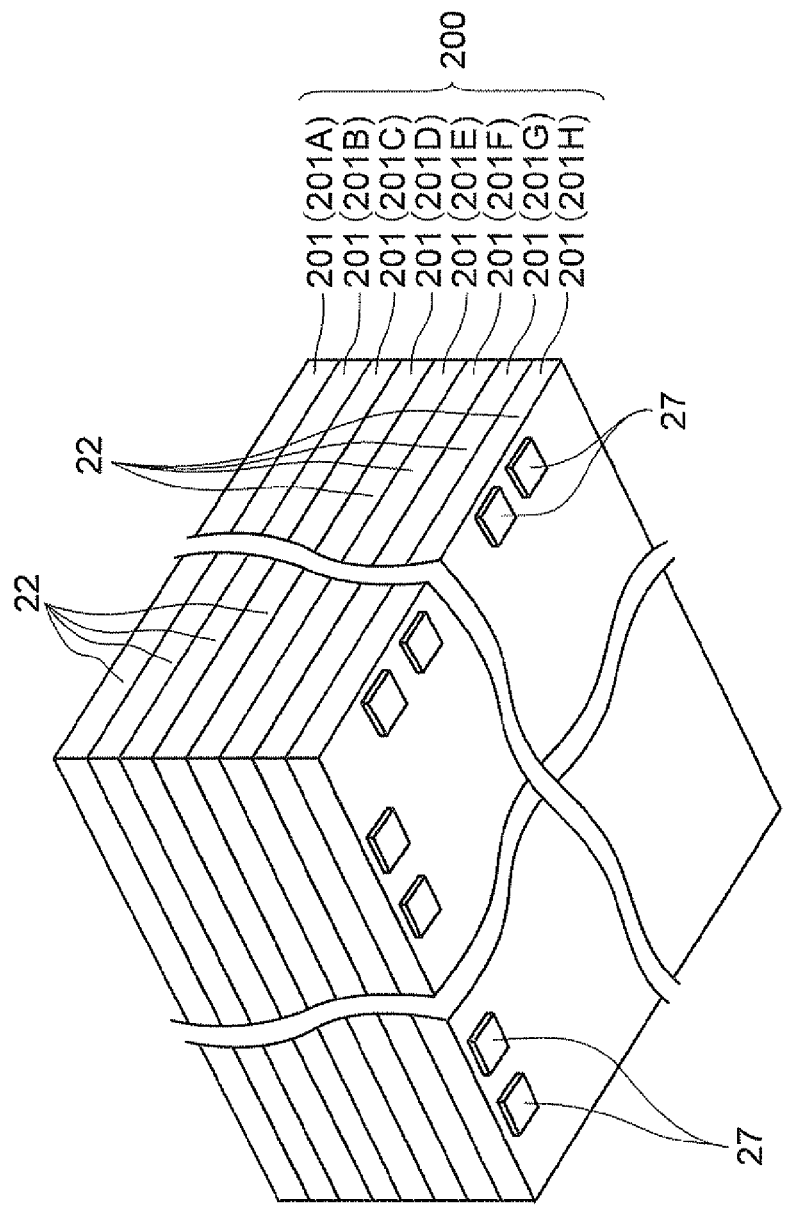
FIG. 7 is a perspective view of a laminated chip package according to the embodiment of the present invention seen from a rear side.
Figure 8:
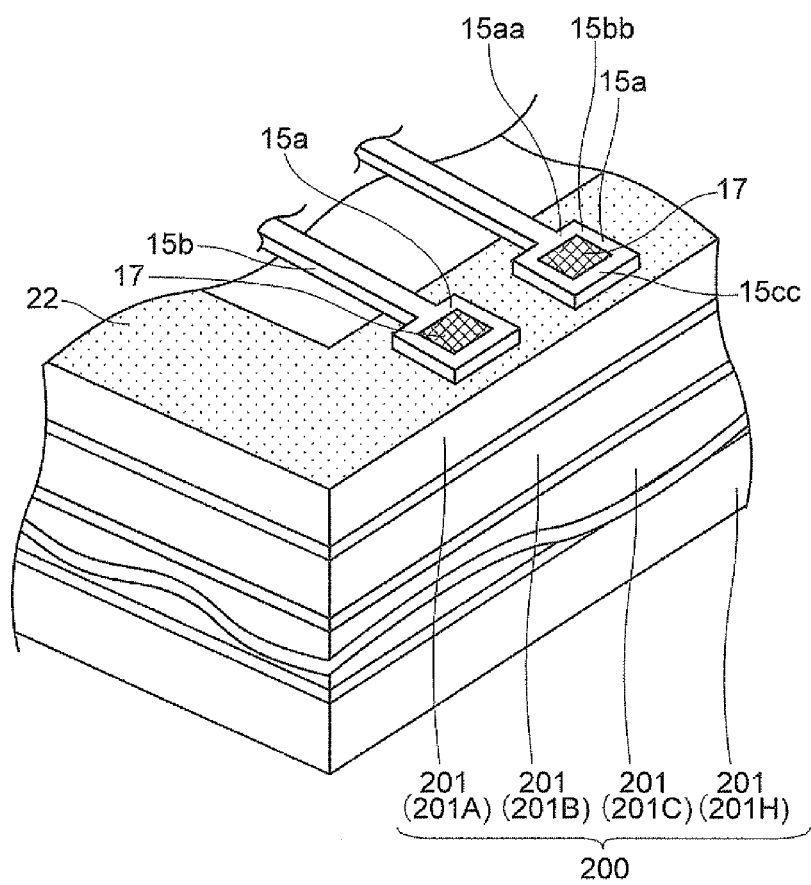
FIG. 8 is a perspective view illustrating a principal part of the laminated chip package illustrated in FIG. 6, with a part of it omitted.
Figure 9:
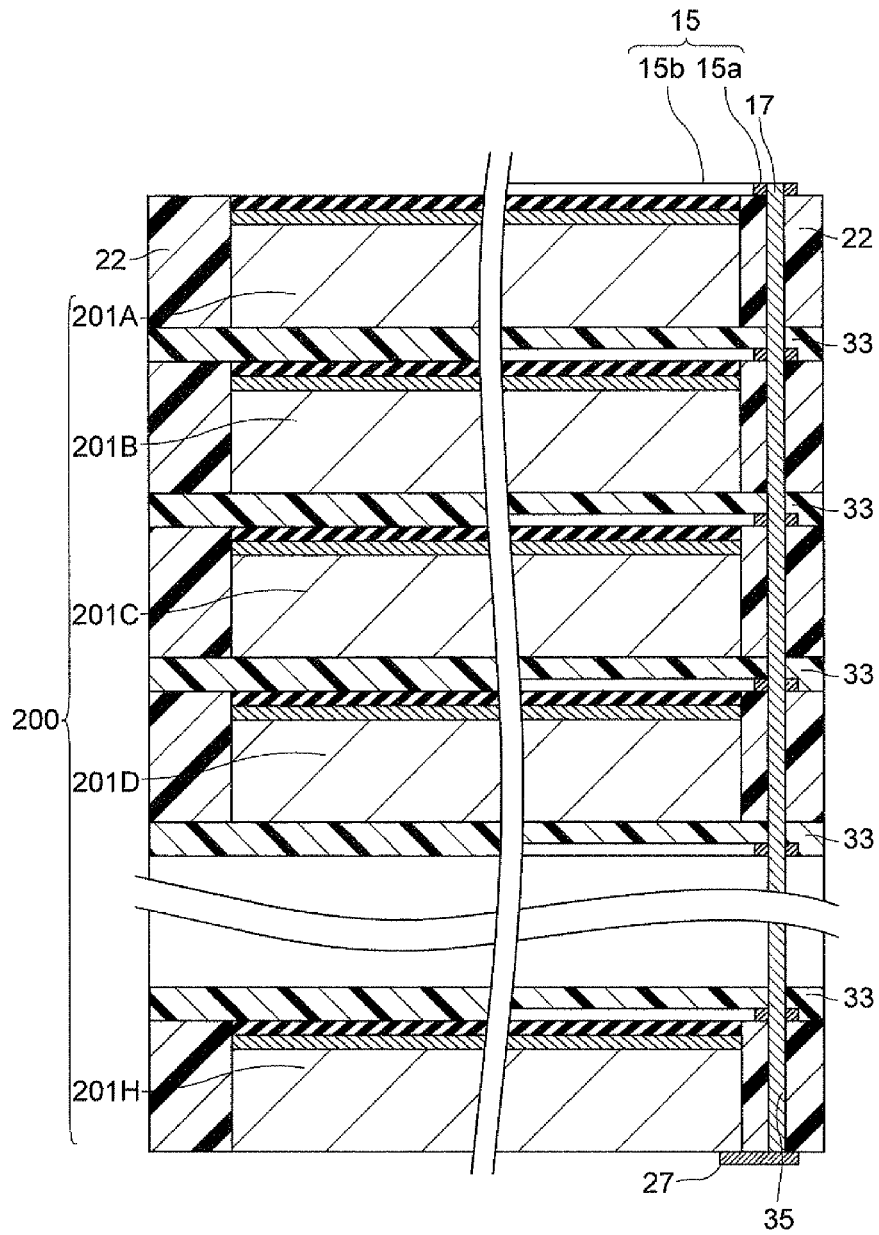
FIG. 9 is a sectional view taken along the line 9-9 in FIG. 6.

By using the laminated semiconductor wafer 100 having the above-described structure, a laminated chip package 200 is able to be manufactured. The structure of the laminated chip package 200 will be described as follows referring to FIG. 6 to FIG. 9. Here, FIG. 6 is a perspective view of a laminated chip package 200 seen from a front side. FIG. 7 is a perspective view of the laminated chip package 200 seen from a rear side. FIG. 8 is a perspective view illustrating a principal part of the laminated chip package 200 with a part of it omitted. FIG. 9 is a sectional view taken along the line 9-9 in FIG. 6.

The laminated chip package 200 is manufactured from the laminated chip region 40A, 40B in the above-described laminated semiconductor wafer 100. The laminated chip package 200 has a structure in which eight semiconductor chips 201 (201A, 201B, 201C, 201D, 201E, 201F, 201G, 201H) are laminated. In the laminated chip package 200, the semiconductor chip 201A as a surface chip is laminated at the uppermost position. Under the semiconductor chip 201A, seven semiconductor chips 201B to 201H are laminated. The semiconductor chips 201A to 201H are bonded together by the adhesive layers 33.

Further, since the laminated chip package 200 is manufactured from the laminated chip region 40A, 40B, a plurality of wiring electrodes 15 are formed on the front side. On the rear side, a plurality of electrode pads 27 are formed. The laminated chip package 200 has the in-groove insulating layers 22 as the resin insulating layers made of insulating resin which are formed to surround the periphery of the laminated chip package 200. The laminated chip package 200 is covered by the in-groove insulating layers 22 in the whole peripheral direction.

The plurality of wiring electrodes 15 are arranged in the same L-figure like pattern as that in the semiconductor wafer 1. Therefore, the boundary sides 10X, 10X connected in an L-figure like four boundary sides 10X, 10X, 10Y, 10Y are set as electrode sides and the boundary sides 10Y, 10Y are set as electrodeless sides as in the semiconductor wafer 1. Further, a plurality of electrode pads 27 are formed at positions corresponding to the wiring electrodes 15 on the rear surface of the semiconductor chip 201H. Therefore, the plurality of electrode pads 27 are also arranged in the same L-figure like pattern as that in the semiconductor wafer 1.

In addition, a plurality of through holes 35 are formed in the laminated chip package 200, and the through electrodes 17 are formed in the respective through holes 35. Each of the through holes 35 penetrates the eight wiring electrodes 15 constituting the laminated electrode group 55 of the semiconductor chips 201A to 201H, the in-groove insulating layers 22, and the adhesive layers 33. The through electrode 17 is a conductor in a one-bar shape passing through the through hole 35 and is in direct contact with the electrode pads 15a of the eight wiring electrodes 15 constituting the laminated electrode group 55.

The laminated chip package 200 is able to realize memories with various storage capacities such as 64 GB (gigabyte), 128 GB, and 256 GB by varying the memory parts in the semiconductor wafer 1. Note that eight semiconductor chips are laminated in the laminated chip package 200. However, it is sufficient that a plurality of semiconductor chips are laminated, and the number of the semiconductor chips which are laminated within the laminated chip package 200 is not limited to eight.

The laminated chip package 200 having the above-described structure can be manufactured using the laminated semiconductor wafer 100, and therefore more laminated chip packages 200 can be manufactured from one laminated semiconductor wafer 100 than from the conventional semiconductor substrate 300. Therefore, it is possible to manufacture more laminated chip packages 200 in a short time. Accordingly, the manufacturing cost of the laminated chip package 200 can be reduced.

Further, the laminated chip package 200 has the through electrode 17 as in the laminated semiconductor wafer 100, and thus has a structure in which the contact resistance caused by the contact between conductors for connecting the semiconductor chips 201 does not occur. Furthermore, all of the semiconductor chips 201 are connected by the through electrode 17. The through electrode 17 is a conductor in a one-bar shape without joint, and thus has a contact resistance lower than the contact resistance in the case where the respective semiconductor wafers 100 are connected by the wiring individually formed in each semiconductor chip 201. Further, since the peripheral surface of the through electrode 17 is in contact with all inner surfaces of the electrode pad 15a facing the hole part 25, a larger contact area is secured between the electrode pad 15a and the through electrode 17 so that the current smoothly flows.

(Method of Manufacturing Laminated Chip Package)

Continuously, the laminated chip package 200 having the above-described structure is able to be manufactured by using the above-described laminated semiconductor wafer 100. In this case, when the laminated semiconductor wafer 100 is cut along the scribe lines 3A and 3B by using the dicing saw, respective laminated chip regions such as the laminated chip regions 40A, 40B are divided into block-like pieces. The respective divided block-like pieces will be the laminated chip packages 200.

Here, when cutting the laminated semiconductor wafer 100, a blade that is a not-illustrated cutting member moves along the groove parts 21 and the groove parts 20. In this case, it is preferable to prevent the blade from coming into contact with the electrode pads 15a. This can make the laminated chip package 200 in an all-round insulation structure. The all-round insulation structure means the structure that the laminated chip package 200 is covered by an insulating material such as the in-groove insulating layer 22 in the whole peripheral direction.

To make the all-round insulation structure, it is better to make the widths of the groove parts 21 and the groove parts 20 as large as possible. However, this can decrease the number of device regions 10 which can be formed on one semiconductor wafer 1. Therefore, it is preferable to make the width of the groove part 21 (also the groove part 20) and the formation position of the electrode pad 15a as follows.

Figure 24:
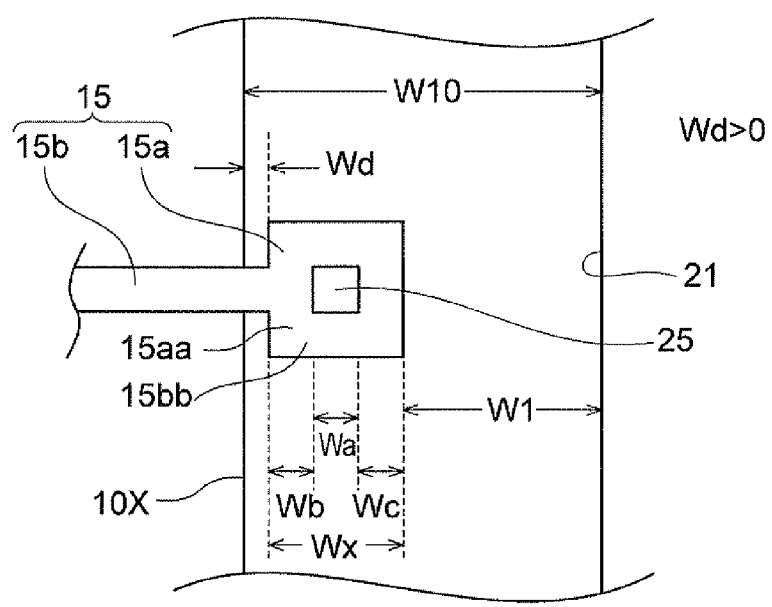
FIG. 24 is a plan view illustrating a principal part of a groove part and the wiring electrode.

When the electrode pad 15a is formed away from the boundary side 10X by a distance Wd like the above-described wiring electrode 15, the size, obtained by subtracting a sum of Wd and a bulging width of the electrode pad 15a (a pad width) from a width of the groove part 21 (this width is referred also to as a groove width) W10, is an electrodeless width W1 as illustrated in FIG. 24. In short, W1=W10−(Wd+WX). Wd is the distance between the electrode pad 15a and the boundary side 10X, and Wd in this case is larger than 0 (Wd>0).

When the electrodeless width W1 is larger than a width WB of the blade, the laminated chip package 200 in the all-round insulation structure is obtained. WX is a sum of a width Wb of the base part 15aa (about 5 μm), a width Wa of the hole part 25 (about 5 μm), and a width Wc of the extended terminal part 15cc (about 5 μm) and is thus about 15 μm. Further, the width WB of the blade ranges from 25 μm to 30 μm. This corresponds to the cutting width according to this embodiment of the present invention. When the electrode pad 15a is formed so that Wd>0 as in FIG. 24, the groove width W10 is at least 40 μm (=15 μm+25 μm)+Wd and need to be larger than 40 μm.

Figure 25:
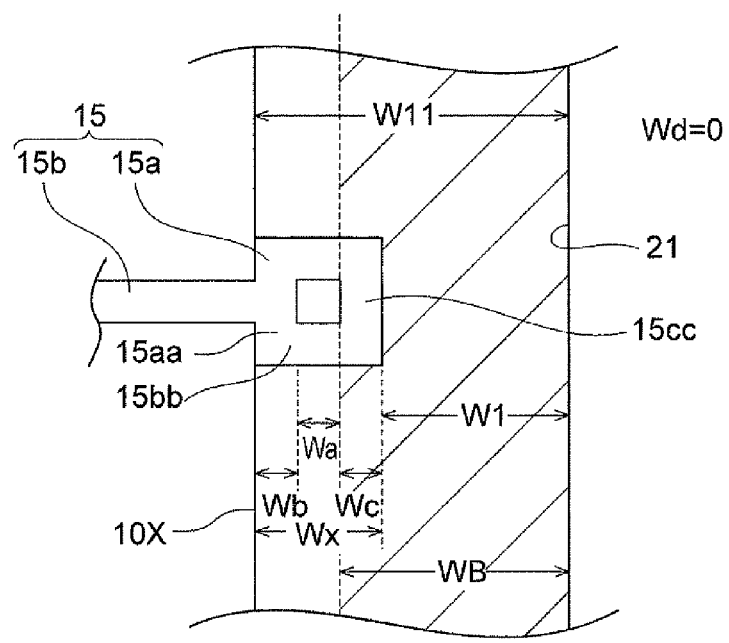
FIG. 25 is a plan view illustrating an another principal part of a groove part and the wiring electrode with FIG. 24.

If Wd is set to 0 as illustrated in FIG. 25, a width W11 of the groove part 21 is reduced by Wd. Therefore, the electrode pad 15a is preferably formed at a position where Wd can be made 0. In other words, it is preferable to arrange the electrode pad 15a in the groove part 20, 21 without forming any gap between the'electrode pad 15a and the boundary side 10X. Thus, the width W11 becomes about 40 μm and can be made smaller than that in the case of FIG. 24.

Further, by setting the electrodeless width W1 smaller than the width WB of the blade, the groove width W11 can be made smaller. For example, it is preferable that the end part of a cut zone by the blade (a part with diagonal lines in FIG. 25) passes through a boundary part between the extended terminal part 15cc and the crossing part 15bb. This makes it possible to make the groove width W11 into a small size of about 35 μm.

Figure 26:
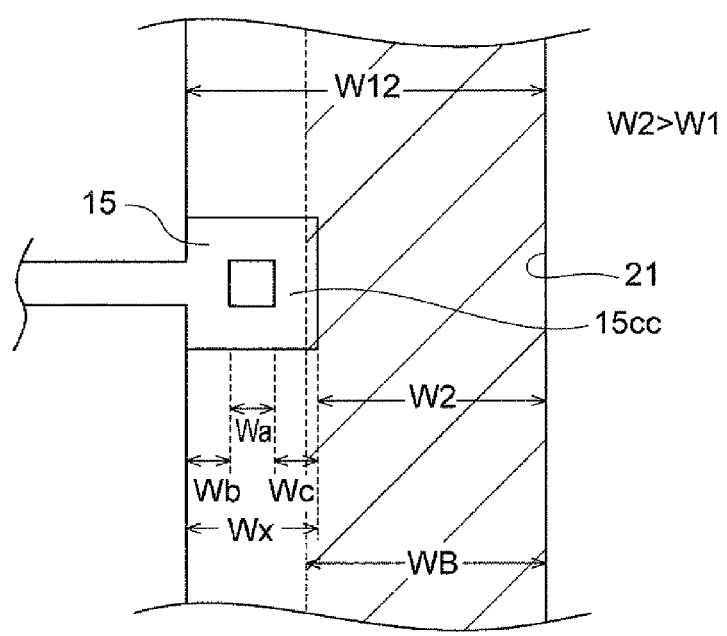
FIG. 26 is a plan view illustrating an another principal part of a groove part and the wiring electrode with FIG. 25.

In this case, the hole part 25 is left as it is, so that the contact state between most of the inner peripheral surface of the electrode pad 15a and the through electrode 17 can be secured, but the contact state between a part of the inner peripheral surface of the electrode pad 15a and the through electrode 17 cannot be secured any longer by cutting the extended terminal part 15cc. In consideration of this point, it is preferable that the end part of a cut zone (a part with diagonal lines in FIG. 26) passes inside the extended terminal part 15cc as illustrated in FIG. 26. This makes it possible to secure the contact state between the whole inner peripheral surface of the electrode pad 15a and the through electrode 17.

Thus, assuming that the size obtained by adding the width WB of the blade and the pad width WX is a designated width, the groove width W12 is preferably equal to or less than the designated width and larger than a value obtained by subtracting the width of the extended terminal part 15cc from the designated width, in the state of Wd=0. In this case, the groove width W12 preferably falls within a range of larger than 35 μm and not larger than 40 μm. This makes it possible to reduce the widths of the groove parts 20, 21 while securing the contact state between the whole inner peripheral surface of the electrode pad 15a and the through electrode 17.

Figure 27:
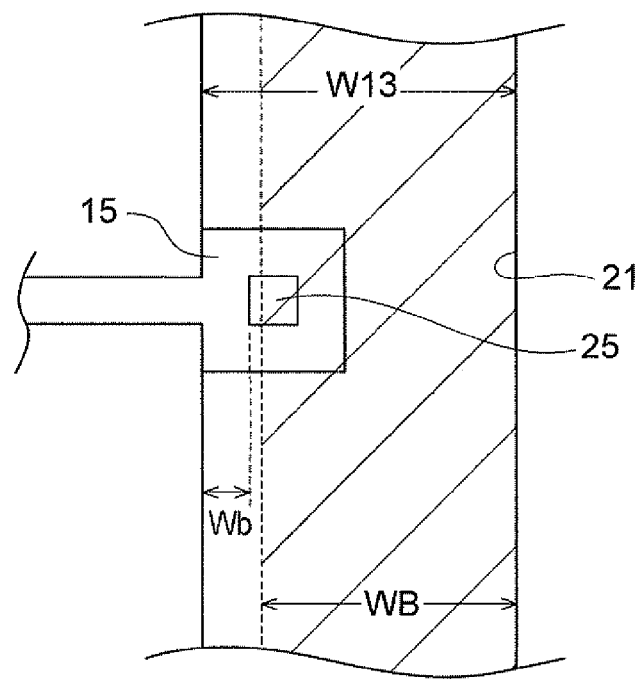
FIG. 27 is a plan view illustrating an another principal part of a groove part and the wiring electrode with FIG. 25.
Figure 28:
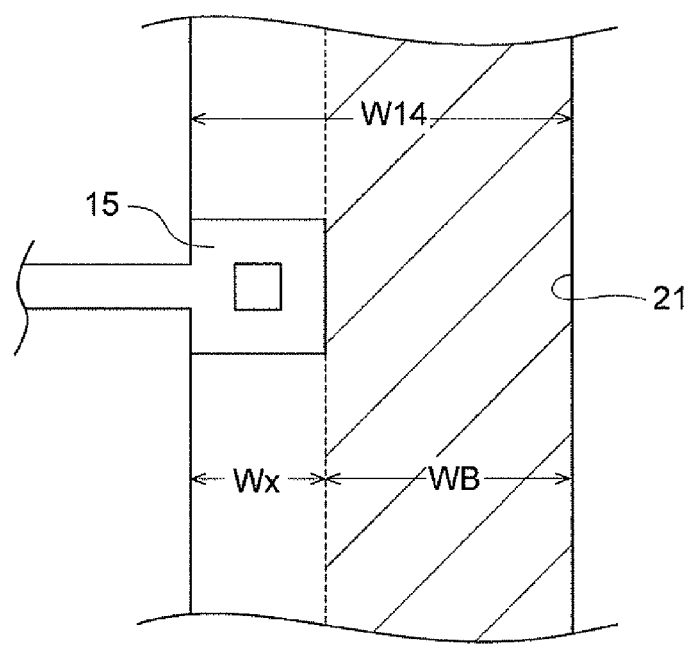
FIG. 28 is a plan view illustrating an another principal part of a groove part and the wiring electrode with FIG. 25.

To further reduce the groove width, it is sufficient to make the cut zone by the blade pass through the hole part 25 as illustrated in FIG. 27. This makes it possible to make a groove width W13 smaller than 35 μm. Note that it is also adoptable to make the cut zone by the blade not pass through the electrode pad 15a. In this case, a groove width W14 is larger than the size obtained by adding the width WB of the blade and the pad width WX as illustrated in FIG. 28, so that the groove width W14 is larger than 40 μm.

Further, the width Wb of the base part 15aa, the width Wa of the hole part 25, and the width Wc of the extended terminal part 15cc are the same in size (about 5 μm) in the above description. However, the width Wb, the with Wa and the width Wc can be made different sizes.

In this case, it is preferable to make all of the width Wb, the width Wa and the width Wc smaller in order to make the groove width as small as possible, but when the width Wa is made smaller, the size of the inner peripheral surface of the electrode pad 15a becomes smaller to make a part thereof in contact with the though electrode 17 smaller. Therefore, it is preferable to make the width Wb and the width Wc smaller while avoiding, as much as possible, the width Wa from becoming smaller. For example, the width Wb can be made 1 μm to 5 μm, the width Wc can be made 0 μm to 2 μm, and the width Wa can be made 3 μm to 5 μm. This makes it possible to set the groove width to 29 μm (=1+3+25 μm).

Figure 29:
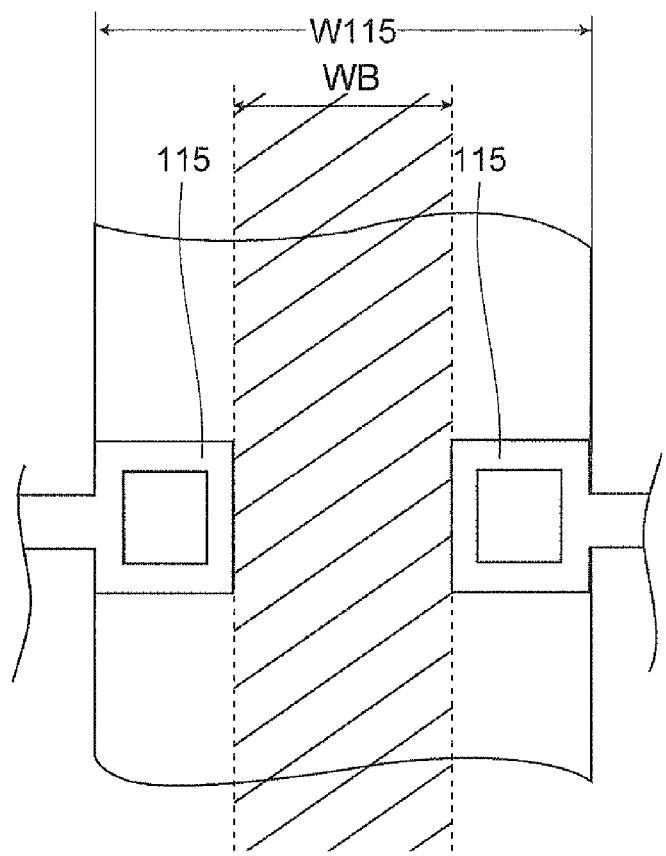
FIG. 29 is a plan view illustrating a principal part of groove part and the wiring electrode which relates the present invention.

On the other hand, in a both-side extending structure as with the wiring electrodes 115 illustrated in FIG. 29, it is necessary to make the groove width enough to secure a pad width WX for two pads in addition to the width WB of the blade. Therefore, even though the electrode pads are in contact with the boundary sides, the groove width W115 is at least about 55 μm (=25 μm+15 μm+15 μm) which is obviously larger than that of the semiconductor wafer 1.

Modified Example

Figure 31:
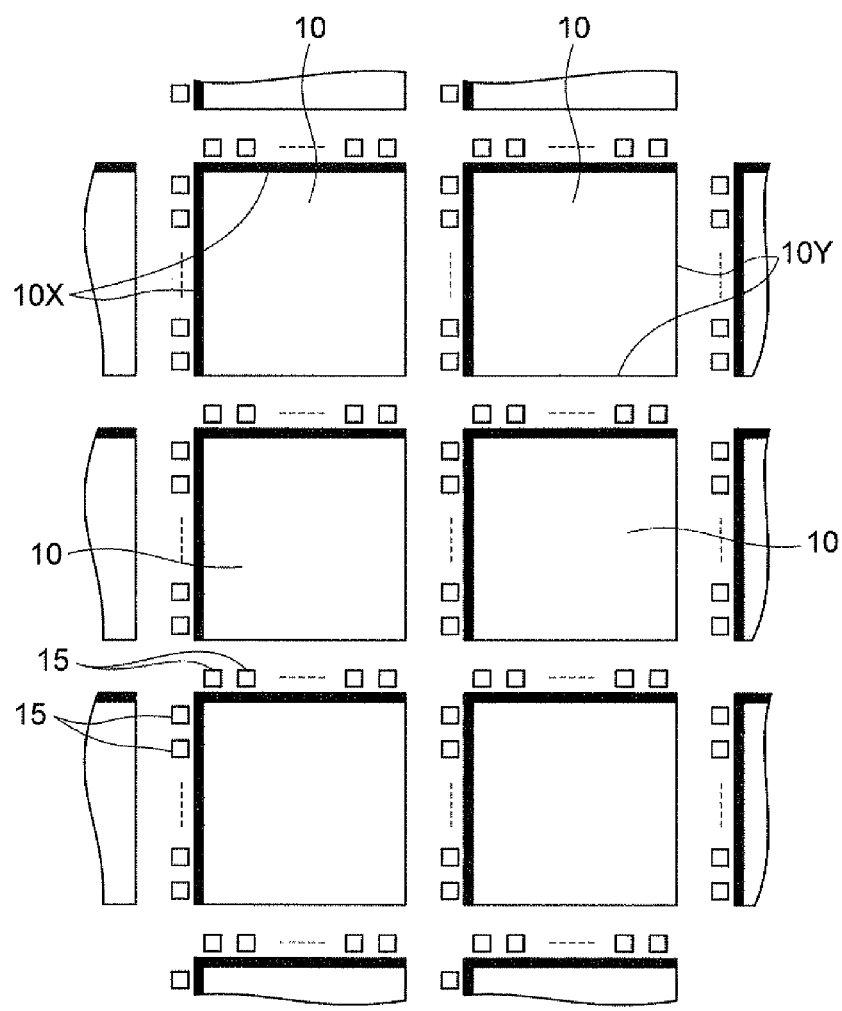
FIG. 31 is a plan view schematically illustrating a arrangement pattern of wiring electrodes in the laminated semiconductor wafer according to a modified example.

In the semiconductor wafer 1 and the laminated semiconductor wafer 110, the positions of the electrode sides 10X, 10Z and the electrodeless sides 10Y, 10Y may be changed as illustrated in FIG. 31. Even in this structure, the number of device regions 10 which can be formed on one substrate can be increased as in the above-described semiconductor wafer 1 and the laminated semiconductor wafer 110.

Second Embodiment

Figure 30:
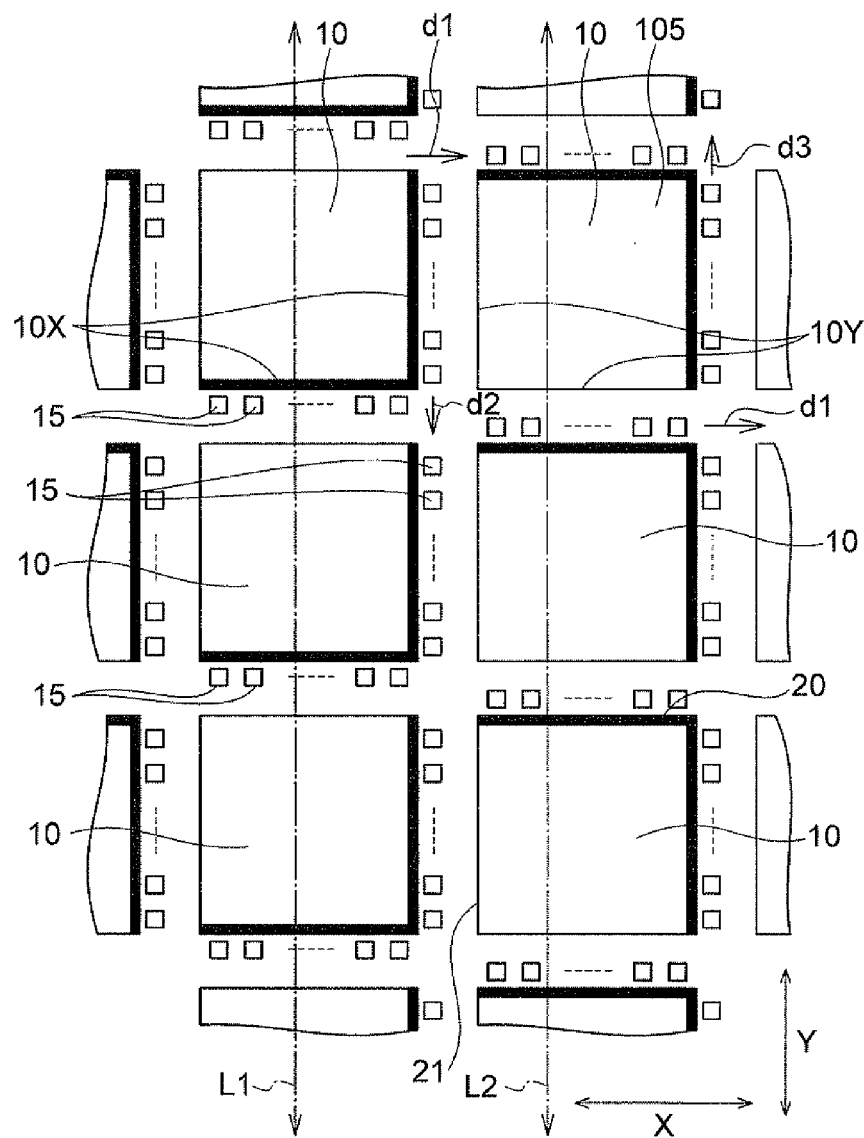
FIG. 30 is a plan view schematically illustrating a arrangement pattern of wiring electrodes in the laminated semiconductor wafer according to the second embodiment of the present invention.

Continuously, a laminated semiconductor wafer 105 according to a second embodiment of the present invention will be explained with reference to FIG. 30. Here, FIG. 30 is a plan view schematically illustrating an arrangement pattern of wiring electrodes 15 in the laminated semiconductor wafer 105 according to the second embodiment.

Also in the laminated semiconductor wafer 105, the wiring electrodes 15 are arranged in the partial arrangement pattern in all of the groove parts 20, 21. In addition, the wiring electrodes 15 are formed in the single-side extending structure. However, the device region 10 around which the wiring electrodes 15 are arranged in the same L-figure like pattern as that in the laminated semiconductor wafer 100 and the device region 10 around which the wiring electrodes 15 are arranged in a reverse L-figure like pattern are alternately arranged along the lateral direction in the laminated semiconductor wafer 105.

In the laminated semiconductor wafer 105, the wiring electrodes 15 are arranged in the L-figure like pattern for each of the device regions 10 arranged side by side along a line L1 in the longitudinal direction. The wiring electrodes 15 are arranged in the reverse L-figure like pattern for each of the device regions 10 arranged side by side along a line L2 adjacent to the line L1. In the case where the wiring electrodes 15 are arranged in the reverse L-figure like pattern, the extending directions of the wiring electrodes 15 are in a combination of the rightward extending direction d1 and an upward extending direction d3. The reverse L-figure like pattern is common with the L-figure like pattern in that two boundary sides connected in an L-figure like at boundaries are set as the electrode sides.

When the L-figure like pattern and the reverse L-figure like pattern alternately appear, the wiring electrodes 15 in the downward extending direction d2 and the wiring electrodes 15 in the upward extending direction d3 alternately appear in the groove parts 20. Therefore, the extending directions of the wiring electrodes 15 in one groove part 20 are two kinds and not unified to one kind. In this case, in order to keep both the wiring electrodes 15 in the extending direction d2 and the wiring electrodes 15 in the extending direction d3 remaining when the laminated semiconductor wafer 105 is cut along the groove part 20, it is necessary to set the width of the groove part 20 to the same size as that of the case where two wiring electrodes 15 are arranged side by side. Accordingly, it is difficult to increase the number of device regions 10 along the Y-direction.

However, all of the extending directions of the wiring electrodes 15 are the extending direction d1 and unified to one kind in the groove part 21. Accordingly, the number of device regions 10 along the X-direction can be increased as in the laminated semiconductor wafer 100. Therefore, the number of device regions 10 which can be formed on one substrate can be increased as a whole also in the laminated semiconductor wafer 105. Accordingly, the number of laminated chip packages which can be manufactured per unit time can be increased also in the laminated semiconductor wafer 105, thereby making it possible to reduce the manufacturing cost of the laminated chip package.

Other Embodiments

Figure 32:
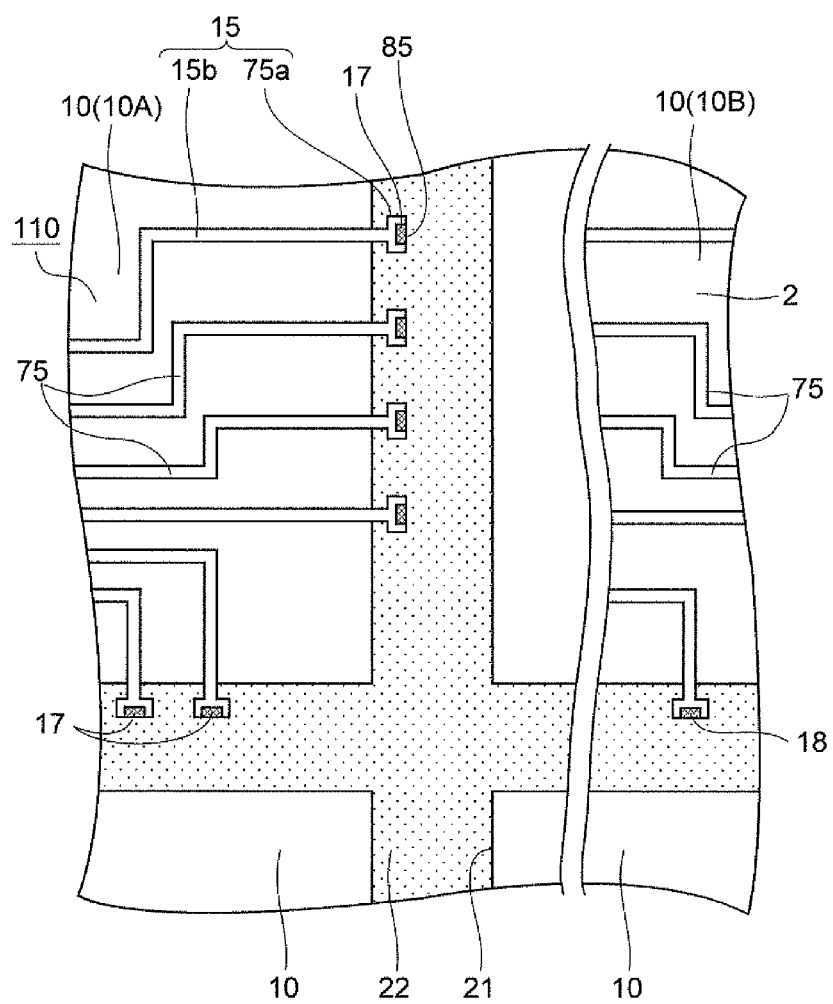
FIG. 32 is a plan view illustrating a principal part of the laminated semiconductor wafer according to another embodiment of the present invention.
Figure 33:
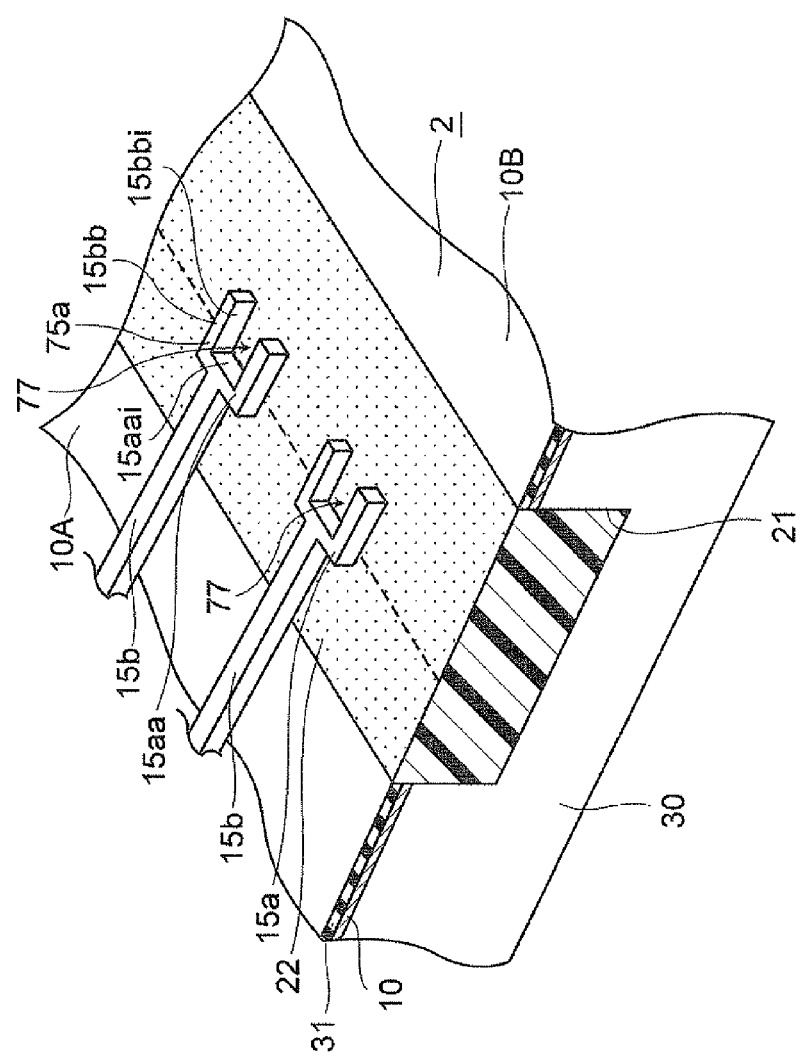
FIG. 33 is a perspective view illustrating a principal part of the semiconductor wafer constituting the laminated semiconductor wafer in FIG. 32.

A laminated semiconductor wafer 110 according to another embodiment of the present invention will be explained with reference to FIG. 32, FIG. 33. Here, FIG. 32 is a plan view illustrating a principal part of the two device region 10 in the laminated semiconductor wafer 110. FIG. 33 is a perspective view illustrating a principal part of the partially manufactured semiconductor wafer 2.

The laminated semiconductor wafer 110 is different in that it is manufactured by using a semiconductor wafer 2, as compared with the laminated semiconductor wafer 100. A plurality of semiconductor wafers 2 are laminated in the laminated semiconductor wafer 110.

The semiconductor wafer 2 is different in that it has wiring electrodes 75 in place of wiring electrodes 15, as compared with the semiconductor wafer 1. The wiring electrodes 75 are different in that they have electrode pads 75a in place of electrode pads 15a, as compared with the electrodes 15. The wiring electrodes 75 are arranged in accordance with the L-figure like pattern similar with the wiring electrodes 15.

The electrode pads 75a are different in that they do not have extended terminal parts 15cc, as compared with the electrode pads 15a. Namely, describing the electrode pad 75a in more detail, the electrode pad 75a has a base part 15aa and two crossing parts 15bb, and is formed in a deformed U-shape surrounding the periphery of a hole part 77 as illustrated in detail in FIG. 33. Further, the two crossing parts 15bb are arranged to open to the inside the groove part 21. Furthermore, the hole part 77 is formed inside the base part 15aa and the two crossing parts 15bb.

In the laminated semiconductor wafer 110, a plurality of through holes 85 similar to the through holes 35 in the laminated semiconductor wafer 100 are formed, and each of through electrodes 17 is formed inside each of the through holes 85, respectively. Note that since FIG. 33 illustrates the partially manufactured semiconductor wafer 2, the through electrodes 17 and the through holes 85 are not illustrated.

In the laminated semiconductor wafer 110 as described above, the wiring electrodes 75 are arranged in the L-figure like pattern for each device region 10 as in the laminated semiconductor wafer 100, so that the number of device regions 10 formed on one semiconductor wafer 2 can be increased.

Furthermore, the two device regions 10A, 10B adjacent to each other are electrically insulated by the in-groove insulating layer 22. Therefore, in the laminated semiconductor wafer 110, similar to the laminated semiconductor wafer 100, the package inspection for the individual laminated chip package is able to be performed in a state of the wafer structure, the laminated semiconductor wafer 110 has a structure in which the package inspection is easily performed for the whole individual laminated chip packages. Therefore, the use of the laminated semiconductor wafer 110 also enables to reduce the manufacturing time of the laminated chip packages, the number of the laminated chip packages manufacturable per unit time can be increased.

Besides, since the laminated semiconductor wafer 110 has the through electrode 17 similar to the laminated semiconductor wafer 100, in the laminated semiconductor wafer 110, the time required for forming the through electrodes can be reduced. Accordingly, the number of the laminated semiconductor wafer 110 manufacturable per unit time can be also further increased by further reducing the manufacturing time. Further, since the laminated semiconductor wafer 110 has the through holes 85 similar to the through holes 35, in the laminated semiconductor wafer 110, it is also possible that the time required for forming the through holes 85 is reduced. Therefore, the number of the laminated semiconductor wafer 110 manufacturable per unit time can be still further increased by still further reducing the manufacturing time.

Meanwhile, since the wiring electrodes 75 do not have the extended terminal parts 15cc, a contact area between the wiring electrodes 75 and the through electrode 17 is reduced as compared with the wiring electrodes 15. However, since the three inner surfaces of the wiring electrodes 75 are in contact with the through electrode 17, contacts between the electrode pads 75a and the through electrode 17 are secured sufficient level for practical use.

Figure 34:
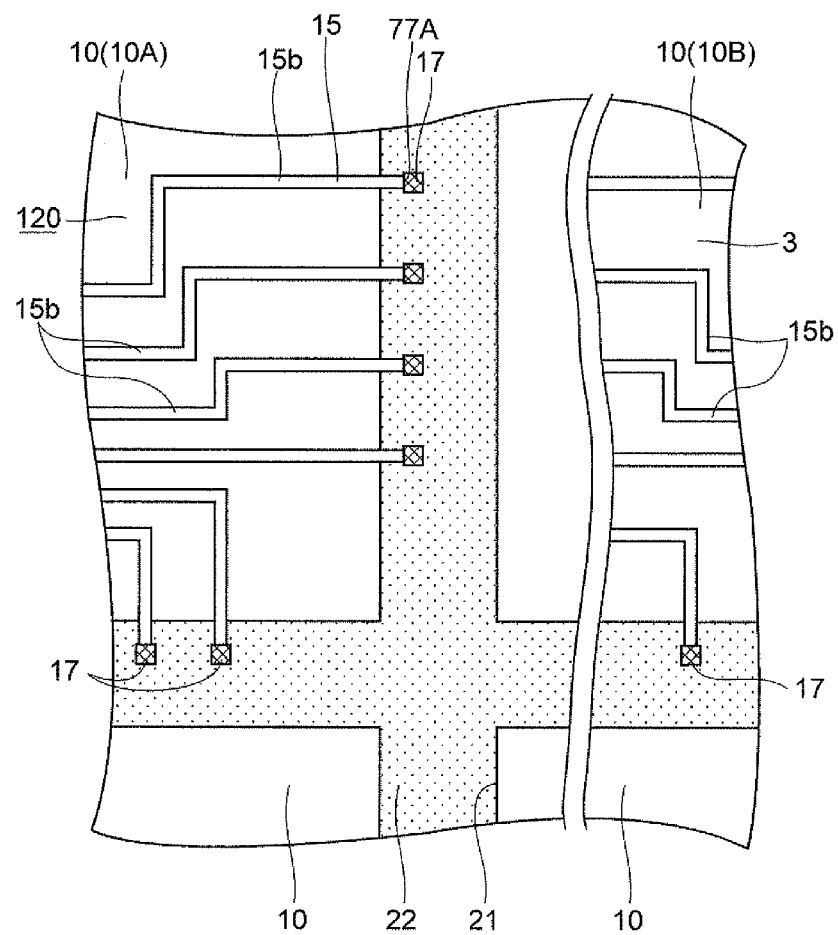
FIG. 34 is a plan view illustrating a principal part of the laminated semiconductor wafer according to still another embodiment of the present invention.
Figure 35:
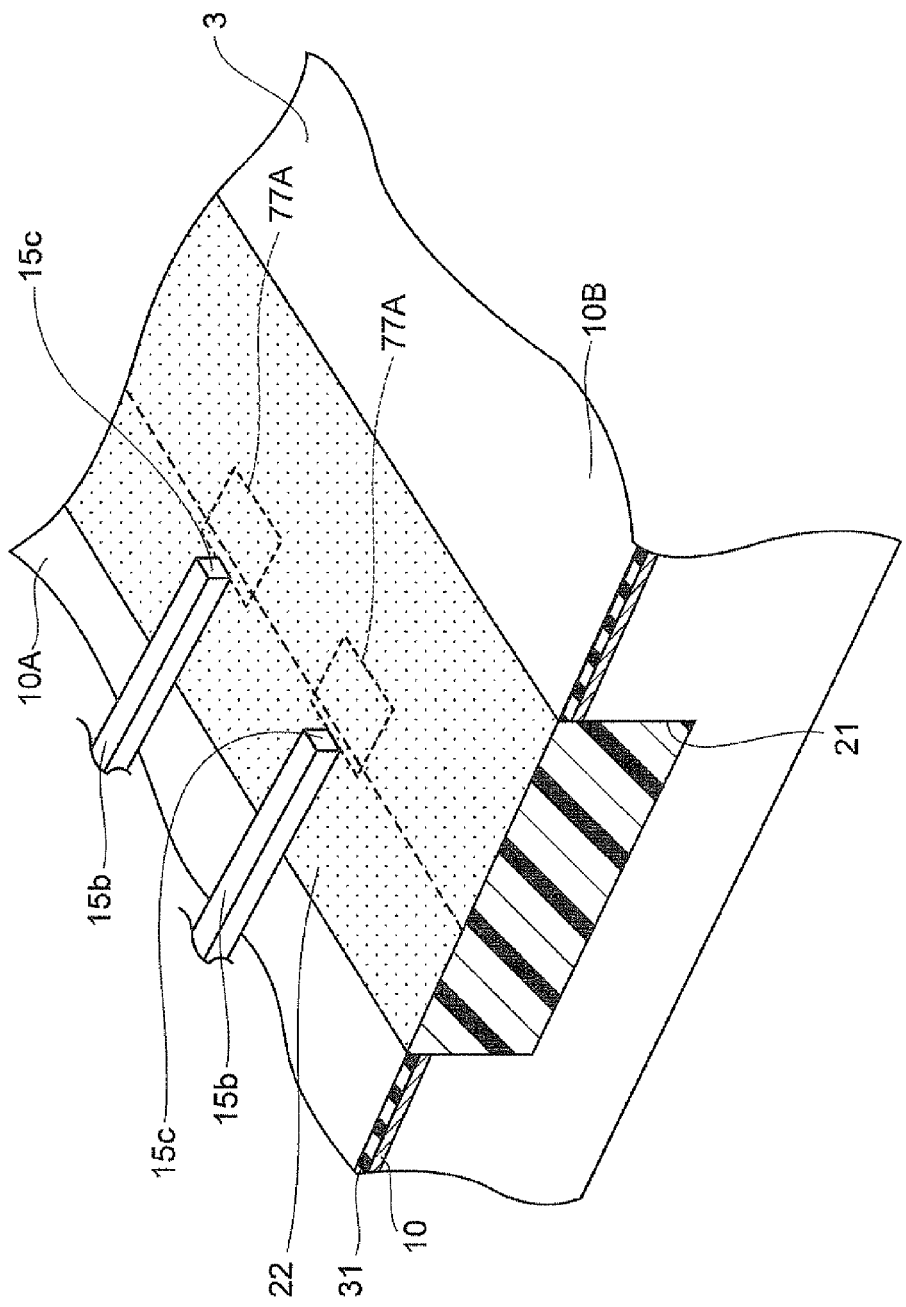
FIG. 35 is a perspective view illustrating a principal part of the semiconductor wafer constituting the laminated semiconductor wafer in FIG. 34.
Figure 36:
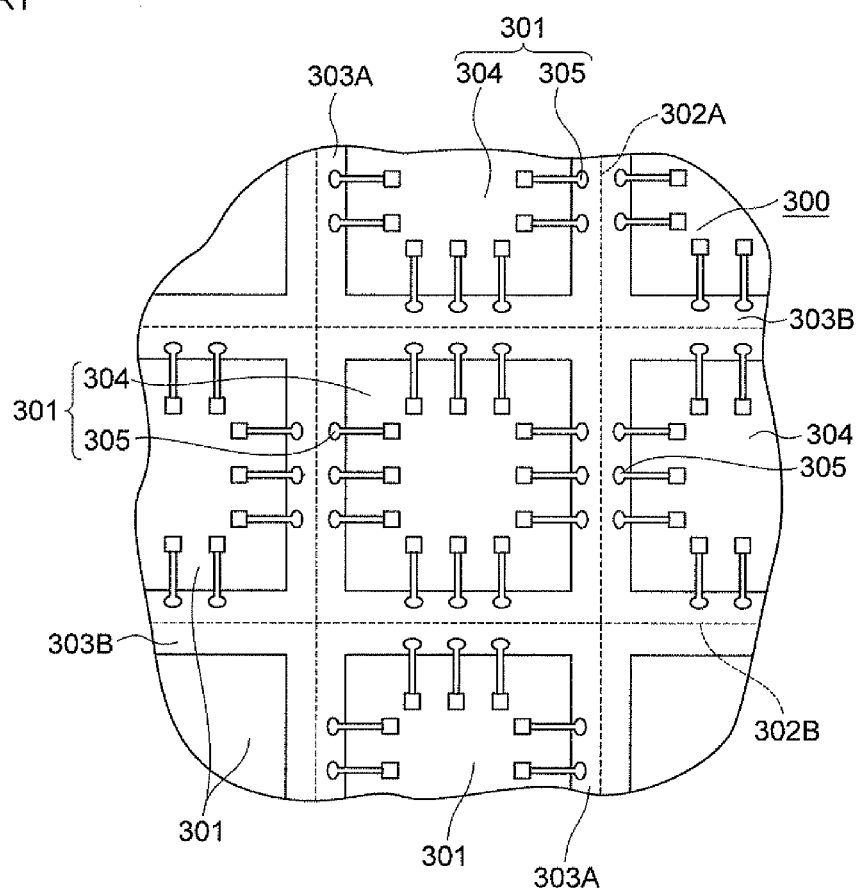
FIG. 36 is a plan view illustrating a principal part of the conventional semiconductor wafer.

Subsequently, a laminated semiconductor wafer 120 according to a still another embodiment of the present invention will be explained with reference to FIG. 34 and FIG. 35. Here, FIG. 34 is a plan view illustrating a principal part of the two device regions 10 of the laminated semiconductor wafer 120. FIG. 35 is a perspective view illustrating a principal part of the partially manufactured semiconductor wafer 3.

The laminated semiconductor wafer 120 is different in that it is manufactured by using a semiconductor wafer 3, as compared with the laminated semiconductor wafer 100. A plurality of semiconductor wafers 3 are laminated in the laminated semiconductor wafer 120.

The semiconductor wafer 3 is different in that the respective wiring electrodes 15 do not have electrode pads 15a, they have only a line-shape terminal parts 15b, as compared with the semiconductor wafer 1.

In the laminated semiconductor wafer 120, a plurality of each of through holes 77A similar to the through holes 35 in the laminated semiconductor wafer 100 are formed, and each of through electrodes 17 is formed inside each of the through holes 77A, respectively. Further, since FIG. 35 illustrates the partially manufactured semiconductor wafer 3, the through electrodes 17 are not illustrated. Since the through holes 77A will be formed later, the through holes 77A are indicated by a dotted line in FIG. 35.

Each of through holes 77A is different in that it is formed such that the tip parts 15c of the line-shape terminal parts 15b appears, as compared with the through holes 35 of the laminated semiconductor wafer 100. In case of this laminated semiconductor wafer 120, since the tip parts 15c of the line-shape terminal parts 15b is extending to the innermost of the groove part 21, the tip parts 15c is an endmost part.

Also in the laminated semiconductor wafer 120 as described above, the wiring electrodes 15 are arranged in the L-figure like pattern for each device region 10 as in the laminated semiconductor wafer 100, so that the number of device regions 10 formed on one semiconductor wafer 2 can be increased.

Further, the laminated semiconductor wafer 120 has the wiring electrodes 15 separated from each other. The two device regions 10A, 10B adjacent to each other are electrically insulated by the in-groove insulating layer 22. Therefore, in the laminated semiconductor wafer 120, similar to the laminated semiconductor wafer 100, the package inspection for the individual laminated chip package is able to be performed in a state of the wafer structure, the laminated semiconductor wafer 120 has a structure in which the package inspection is easily performed for the whole individual laminated chip packages. Therefore, the use of the laminated semiconductor wafer 120 also enables to reduce the manufacturing time of the laminated chip packages, the number of the laminated chip packages manufacturable per unit time can be increased.

Besides, since the laminated semiconductor wafer 120 has the through electrode 17 similar to the laminated semiconductor wafer 100, in the laminated semiconductor wafer 120, the time required for forming the through electrodes can be reduced. Accordingly, the number of the laminated semiconductor wafer 120 manufacturable per unit time can be further increased by further reducing the manufacturing time. Further, since the laminated semiconductor wafer 120 has the through holes 77A similar to the through holes 35, in the laminated semiconductor wafer 120, it is also possible that the time required for forming the through holes 77A is reduced. Therefore, the number of the laminated semiconductor wafer 120 manufacturable per unit time can be still further increased by still further reducing the manufacturing time.

Meanwhile, since the laminated semiconductor wafer 120 do not have the electrode pads 15a, a contact area between the wiring electrodes 15 and the through electrode 17 is reduced as compared with the laminated semiconductor wafer 100. However, regarding the wiring electrodes 15 and the through electrode 17, since the tip parts 15c is in contact with the through electrode 17, a contact between the wiring electrodes 15 and the through electrodes 17 are secured.

In the above-described embodiments, the laminated electrode group 55 is composed of eight common wiring electrodes laminated in the laminated direction. The wafer test is performed by measuring the electrical characteristics in each chip planned part for each semiconductor wafer 1 before lamination. As a result of performing the wafer test and the quality judgment on each chip planned part, a bad chip planned part may be included in the semiconductor wafer 1. However, only good chip planned parts need to be used for the laminated chip package 200.

Therefore, when a bad chip planned part is included in the semiconductor wafer 1, it is preferable not to form the wiring electrode in the bad chip planned part. In this case, the positional information of the bad chip planned part is saved during the wafer test so that the wiring electrode is not formed in the device region according to the positional information in the substrate manufacturing process. By this, the bad chip planned part can be excluded from the subject for electrical connection, though the bad chip planned part is physically included in the laminated chip package.

Further, the laminated chip package including the bad chip planned part may be excluded as a bad product. In this case, identification information of the semiconductor wafer including the bad chip planned part is saved together with the positional information of the bad chip planned part, and the laminated chip package including the bad chip planned part may be excluded at a stage of the package inspection according to the positional information and the identification information.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A laminated semiconductor wafer comprising a plurality of semiconductor substrates having a plurality of scribe-groove parts formed along scribe lines, the plurality of semiconductor substrates including:

a plurality of device regions each in contact with at least one of the plurality of scribe-groove parts, having a semiconductor device formed therein, formed in a rectangular shape, and insulated; and a plurality of wiring electrodes connected to the semiconductor devices respectively formed in the plurality of device regions and extending from the device regions into the inside of the scribe-groove parts, wherein the plurality of wiring electrodes are arranged, for each of the plurality of device regions, in a partial arrangement pattern in which the wiring electrodes are arranged along only a part of four boundary sides corresponding to boundaries between each of the device regions and the scribe-groove parts, and extend into the scribe-groove part from only one of two device regions adjacent to each other with the scribe-groove part therebetween among the plurality of device regions, a through hole formed therein which penetrates the scribe-groove parts of the plurality of semiconductor substrates laminated in a laminated direction in which the plurality of semiconductor substrates are laminated, and in which a plurality of the wiring electrodes, constituting a laminated electrode group laminated in the laminated direction among the plurality of wiring electrodes, appear;

a through electrode which penetrates all of the plurality of semiconductor substrates through the through hole and is in contact with all of the wiring electrodes appearing in the through hole; and a plurality of laminated chip regions each of which is composed of the device regions laminated in the laminated direction in all of the plurality of semiconductor substrates.

2. The laminated semiconductor wafer according to claim 1, wherein the wiring electrode has an electrode pad having a hole part formed along the laminated direction, and wherein the electrode pad is arranged in the scribe-groove part without a gap formed between the electrode pad and the boundary side.

3. The laminated semiconductor wafer according to claim 1, wherein the plurality of scribe-groove parts are formed in a lattice form in which a plurality of lateral groove parts formed in a lateral direction and a plurality of longitudinal groove parts intersecting at right angles to the lateral groove parts intersect in a cross shape, and wherein the wiring electrodes extend from only one of the two device regions adjacent to each other with the scribe-groove part therebetween in all of the plurality of lateral groove parts and the plurality of longitudinal groove parts.

4. The laminated semiconductor wafer according to claim 3, wherein assuming that a direction in which the wiring electrodes extend from the device region into the scribe-groove part is an extending direction, the extending direction and the partial arrangement pattern are common in all of the plurality of device regions.

5. The laminated semiconductor wafer according to claim 1, wherein the partial arrangement pattern is an L-figure like pattern in which two boundary sides connected in an L-figure like among the four boundary sides in each of the plurality of device regions are set as electrode sides along which the wiring electrodes are arranged and two boundary sides other than the electrode sides are set as electrodeless sides along which the wiring electrodes are not arranged, and the L-figure like pattern is common in all of the plurality of device regions.

6. The laminated semiconductor wafer according to claim 2, wherein assuming that a width of a cutting member used in cutting the laminated semiconductor substrate at the scribe-groove part is a cut width and a width of the electrode pad bulging out from the boundary side is a pad width, a width of the scribe-groove part is set not to exceed a size obtained by adding the cut width and the pad width.

7. The laminated semiconductor wafer according to claim 1, wherein the wiring electrode has an electrode pad having a hole part formed along the laminated direction, and the through hole is formed along the hole part.

8. The laminated semiconductor wafer according to claim 2, wherein the electrode pad is formed in a rectangular shape or in a U-figure like shape disposed such that both end parts open toward the inside of the scribe-groove part.

9. The laminated semiconductor wafer according to claim 1, wherein the laminated semiconductor substrate is composed by laminating one or two or more unit laminated substrates in each of which four semiconductor substrates are laminated.

10. A semiconductor substrate having a plurality of scribe-groove parts formed along scribe lines, a plurality of device regions each in contact with at least one of the plurality of scribe-groove parts, having a semiconductor device formed therein, formed in a rectangular shape, and insulated; and a plurality of wiring electrodes connected to the semiconductor devices respectively formed in the plurality of device regions and extending from the device regions into the inside of the scribe-groove parts, wherein the plurality of wiring electrodes are arranged in a partial arrangement pattern in which the wiring electrodes are arranged along only a part of four boundary sides corresponding to boundaries between each of the device regions and the scribe-groove parts for each of the plurality of device regions, and extend into the scribe-groove part from only one of two device regions adjacent to each other with the scribe-groove part therebetween among the plurality of device regions.

11. The semiconductor substrate according to claim 10, wherein the wiring electrode has an electrode pad having a hole part formed along a laminated direction, and wherein the electrode pad is arranged in the scribe-groove part without a gap formed between the electrode pad and the boundary side.

12. The semiconductor substrate according to claim 10, wherein the plurality of scribe-groove parts are formed in a lattice form in which a plurality of lateral groove parts formed in a lateral direction and a plurality of longitudinal groove parts intersecting at right angles to the lateral groove parts intersect in a cross shape, and wherein the wiring electrodes extend from only one of the two device regions adjacent to each other with the scribe-groove part therebetween in all of the plurality of lateral groove parts and the plurality of longitudinal groove parts.

13. The semiconductor substrate according to claim 12, wherein assuming that a direction in which the wiring electrodes extend from the device region into the scribe-groove part is an extending direction, the extending direction and the partial arrangement pattern are common in all of the plurality of device regions.

14. The semiconductor substrate according to claim 10, wherein the partial arrangement pattern is an L-figure like pattern in which two boundary sides connected in an L-figure like among the four boundary sides in each of the plurality of device regions are set as electrode sides along which the wiring electrodes are arranged and two boundary sides other than the electrode sides are set as electrodeless sides along which the wiring electrodes are not arranged, and the L-figure like pattern is common in all of the plurality of device regions.

15. The semiconductor substrate according to claim 11, wherein assuming that a width of a cutting member used in cutting the semiconductor substrate at the scribe-groove part is a cut width and a width of the electrode pad bulging out from the boundary side is a pad width, a width of the scribe-groove part is set not to exceed a size obtained by adding the cut width and the pad width.

16. A laminated chip package comprising a plurality of semiconductor chips,
each of the plurality of semiconductor chips comprising:
a resin insulating layer made of an insulating resin formed to surround a periphery of a device region in a rectangular shape in which the semiconductor device is formed; and
a plurality of wiring electrodes connected to the semiconductor device and having end parts arranged on the resin insulating layer,
wherein the plurality of wiring electrodes are arranged in a partial arrangement pattern in which the wiring electrodes are arranged along only a part of four boundary sides corresponding to boundaries between the device region and the resin insulating layer, and two boundary sides connected in an L-figure like among the four boundary sides in the device region are set as electrode sides along which the wiring electrodes are arranged and two boundary sides other than the electrode sides are set as electrodeless sides along which the wiring electrodes are not arranged,
the laminated chip package comprising:
a through hole formed therein which penetrates the resin insulating layers of the plurality of semiconductor chips laminated in a laminated direction in which the plurality of semiconductor chips are laminated, and in which a plurality of the wiring electrodes, constituting a laminated electrode group laminated in the laminated direction among the wiring electrodes, appear; and
a through electrode which penetrates all of the plurality of semiconductor chips through the through hole and is in contact with all of the wiring electrodes appearing in the through hole.

17. The laminated chip package according to claim 16, wherein the wiring electrode has an electrode pad arranged on the resin insulating layer and having a hole part formed along the laminated direction, and
wherein the electrode pad is arranged on the resin insulating layer without a gap formed between the electrode pad and the boundary side.

18. A method of manufacturing a laminated semiconductor substrate, comprising:
a device region forming step of forming a plurality of scribe-groove parts along scribe lines in an unprocessed substrate having semiconductor devices formed therein to form a plurality of device regions each of which is in contact with at least one of the plurality of scribe-groove parts and has the semiconductor device formed therein;
a substrate manufacturing step of manufacturing a substrate with electrode by forming a plurality of wiring electrodes connected to the semiconductor devices respectively formed in the plurality of device regions and extending from the device regions into the inside of the scribe-groove parts, such that the plurality of wiring electrodes are arranged, for each of the plurality of device regions, in a partial arrangement pattern in which the wiring electrodes are arranged along only a part of four boundary sides corresponding to boundaries between each of the device regions and the scribe-groove parts, and extend into the scribe-groove part from only one of two device regions adjacent to each other with the scribe-groove part therebetween;
a laminating step of laminating a plurality of the substrates with electrode to manufacture a laminated wafer;
a through hole forming step of forming, for the laminated wafer, a through hole which penetrates the scribe-groove parts of the plurality of substrates with electrode laminated in a laminated direction in which the plurality of substrates with electrode are laminated, and in which a plurality of the wiring electrodes, constituting a laminated electrode group laminated in the laminated direction among the wiring electrodes, appear; and
a through electrode forming step of forming a through electrode in contact with all of the wiring electrodes appearing in the through hole such that the through electrode penetrates all of the plurality of substrates with electrode through the through hole.

19. The method of manufacturing a laminated semiconductor substrate according to claim 18,
wherein in the substrate manufacturing step, the wiring electrode is formed in a shape with an electrode pad having a hole part formed along the laminated direction, and the electrode pad is arranged in the scribe-groove part without a gap formed between the electrode pad and the boundary side.

20. The method of manufacturing a laminated semiconductor substrate according to claim 18,
wherein in the substrate manufacturing step, two boundary sides connected in an L-figure like among the four boundary sides in the device region are set as electrode sides along which the wiring electrodes are arranged and two boundary sides other than the electrode sides are set as electrodeless sides along which the wiring electrodes are not arranged.

21. The method of manufacturing a laminated semiconductor substrate according to claim 19,
wherein in the device region forming step, assuming that a width of a cutting member used in cutting the laminated semiconductor substrate at the scribe-groove part is a cut width and a width of the electrode pad bulging out from the boundary side is a pad width, a width of the scribe-groove part is set not to exceed a size obtained by adding the cut width and the pad width.

22. A method of manufacturing a laminated chip package, comprising the step of:
cutting the laminated semiconductor substrate manufactured by the manufacturing method according to claim 18 along the scribe-groove parts to cause resin insulating layers made of an insulating resin to appear in a cut surface to manufacture laminated chip packages.

* * * * *